US007943404B2

(12) United States Patent
Ding et al.

(10) Patent No.: US 7,943,404 B2
(45) Date of Patent: May 17, 2011

(54) INTEGRATED MILLIMETER WAVE ANTENNA AND TRANSCEIVER ON A SUBSTRATE

(75) Inventors: Hanyi Ding, Colchester, VT (US); Kai D. Feng, Hopewell Junction, NY (US); Zhong-Xiang He, Essex Junction, VT (US); Zhenrong Jin, Essex Junction, VT (US); Xuefeng Liu, South Burlington, VT (US)

(73) Assignee: International Business Machines Corporation, Armonk, NY (US)

( * ) Notice: Subject to any disclaimer, the term of this patent is extended or adjusted under 35 U.S.C. 154(b) by 240 days.

(21) Appl. No.: 12/187,436

(22) Filed: Aug. 7, 2008

(65) Prior Publication Data

US 2010/0035370 A1 Feb. 11, 2010

(51) Int. Cl.
*H01L 21/00* (2006.01)

(52) U.S. Cl. ........................... 438/29; 343/850; 343/856

(58) Field of Classification Search .............. 438/22–24, 438/29, 34, 48, 57, 622; 257/E21.001; 343/850, 343/700 MS; 455/73, 88, 89

See application file for complete search history.

(56) References Cited

U.S. PATENT DOCUMENTS 6,633,079 B2 10/2003 Cheever et al.
6,933,906 B2 8/2005 Stolle et al.
7,489,914 B2 * 2/2009 Govind et al. ............. 455/168.1
2001/0050651 A1 12/2001 Grangeat et al.
2003/0020069 A1 1/2003 Holmes et al.
2004/0185901 A1 9/2004 Kachi et al.
2006/0157798 A1 * 7/2006 Hayashi et al. ............... 257/374
2007/0063056 A1 * 3/2007 Gaucher et al. ............... 235/492
2007/0296073 A1 * 12/2007 Wu et al. ........................ 257/686
2008/0083881 A1 * 4/2008 Gorrell et al. ................ 250/399

OTHER PUBLICATIONS

Buechler et al., "Silicon High Resistivity-Substrate Millimeter Wave Technology", IEEE Transactions on Microwave-Theory and Technologies. Dec. 1986. pp. 2047-2052.

* cited by examiner

*Primary Examiner* — David Vu
*Assistant Examiner* — Shaun Campbell
(74) *Attorney, Agent, or Firm* — Scully, Scott, Murphy & Presser, P.C.; Anthony J. Canale

(57) ABSTRACT

A semiconductor chip integrating a transceiver, an antenna, and a receiver is provided. The transceiver is formed on a front side of a semiconductor substrate. At least one through substrate via provides electrical connection between the transceiver and the backside of the semiconductor substrate. The antenna, which is connected to the transceiver, is formed in a dielectric layer on the front side. The reflector plate is connected to the through substrate via, and is formed on the backside. The separation between the reflector plate and the antenna is about the quarter wavelength of millimeter waves, which enhances radiation efficiency of the antenna. An array of through substrate trenches may be formed and filled with a dielectric material to reduce the effective dielectric constant of the material between the antenna and the reflector plate, thereby reducing the wavelength of the millimeter wave and enhance the radiation efficiency.

18 Claims, 18 Drawing Sheets

INTEGRATED MILLIMETER WAVE ANTENNA AND TRANSCEIVER ON A SUBSTRATE

RELATED APPLICATIONS

The present application is related to co-pending U.S. application Ser. No. 12/187,442, which is incorporated herein by reference.

FIELD OF THE INVENTION

The present invention relates to semiconductor structures, and particularly to a semiconductor structure including an integrated millimeter wave antenna, a reflector plate, and a transceiver on a substrate, and methods of forming the same.

BACKGROUND OF THE INVENTION

Millimeter waves refer to electromagnetic radiation having a wavelength range from about 1 mm to about 10 mm. The corresponding frequency range for millimeter waves is from about 30 GHz to about 300 GHz. The wavelength range for the millimeter waves occupies the highest frequency range for microwaves, and is also referred to as extremely high frequency (EHF). The frequency range for the millimeter waves is the highest radio frequency band, and the electromagnetic radiation having a higher frequency than the millimeter waves is considered to be a far end (a long end) of the infrared radiation.

Millimeter waves display frequency-dependent atmospheric absorption due to oxygen and water vapor. The absorption coefficient for oxygen in atmosphere ranges from about 0.01 dB/km to about 10 dB/km, and the absorption coefficient for water vapor in atmosphere ranges from about 0.03 dB/km to about 30 dB/km. Due to the atmospheric absorption, the strength of a millimeter wave signal decreases more with distance than radio frequency signals at lower frequency.

While attenuation characteristics of millimeter waves limit the range of signal communication, the rapid signal attenuation with distance of the millimeter wave also enables frequency reuses. In other words, an array of millimeter wave signal transmitters may share the same frequency range for a subset of millimeter wave signal transmitters that are separated from each other by a sufficient distance. For this reason, millimeter waves are employed for short range radio communication including cellular phone applications.

The capture of millimeter wave signals poses a unique difficulty due to the short wavelength of the millimeter wave signals. While manufacture of an antenna for the millimeter waves is straightforward since the dimensions of the antenna to be employed for capture of the millimeter waves is in the range of a few millimeters, guidance of the signal from the antenna through a signal transmission line to a transceiver introduces a series of signal reflections at each connection at which the impedance of the components is not matched.

Prior efforts to attach a millimeter wave antenna to a semiconductor chip through a C4 pad or a wirebond pad have resulted in mismatched impedance at the interface between the antenna and the semiconductor chip, which is typically the C4 ball or the wirebond pad. Further, aligning a reflector plate, which is necessary to increase efficiency of the antenna, to the semiconductor chip and the antenna to provide structural integrity is a challenging task.

Incorporation of a millimeter wave antenna into a wiring level dielectric material layer on a semiconductor chip has resulted in poor performance since the distance between the antenna and the reflector plate needs to about the quarter wavelength of the millimeter wave, which is in the range of hundreds of microns, and the total thickness of a metal wiring structure in conventional semiconductor chips is from several microns to about 20 microns. Without a sufficient volume to incorporate a functional reflector plate, any prior art integrated antenna in a semiconductor chip displays poor signal capture efficiency, rendering such an antenna inefficient.

In view of the above, there exists a need for a structure incorporating a transceiver, a millimeter wave antenna, and a reflector plate that captures millimeter wave signals effectively and routes the signal to a transceiver on a semiconductor chip with minimal signal loss.

Further, there exists a need for methods of manufacturing such a millimeter wave antenna.

SUMMARY OF THE INVENTION

To address the needs described above, the present invention provides semiconductor structure including a millimeter wave antenna, a reflector plate, and a transceiver that are integrated on a substrate, and methods of forming the same.

In the present invention, a semiconductor chip integrating a transceiver, an antenna, and a receiver is provided. The transceiver is formed on a front side of a semiconductor substrate. At least one through substrate via provides electrical connection between the transceiver and the backside of the semiconductor substrate. The antenna, which is connected to the transceiver, is formed in a dielectric layer on the front side of the substrate. The reflector plate is connected to the through substrate via, and is formed on the backside of the semiconductor substrate. The separation between the reflector plate and the antenna is about a quarter wavelength of millimeter waves, which enhances radiation efficiency of the antenna. An array of through substrate trenches may be formed and filled with a dielectric material to reduce the effective dielectric constant of the material between the antenna and the reflector plate, thereby reducing the wavelength of the millimeter wave and enhance the radiation efficiency.

According to an embodiment of the present invention, a method of forming a semiconductor structure is provided, which comprises:

forming a millimeter wave transceiver on a semiconductor substrate;

forming at least one dielectric material layer on and above the millimeter wave transceiver;

forming an antenna electrically connected to the millimeter wave transceiver on the at least one dielectric material layer;

forming at least one through substrate conductive via through the semiconductor substrate and directly on the millimeter wave transceiver; and forming a reflector plate directly on the at least one through substrate conductive via.

In one embodiment, the method further comprises forming a pair of metal interconnect structures abutting the millimeter wave transceiver in the at least one dielectric material layer, wherein the antenna abuts the pair of metal interconnect structures.

In another embodiment, the millimeter wave transceiver is formed directly on a front surface of the semiconductor substrate, and wherein the reflector plate is located directly on a back surface of the semiconductor substrate.

In even another embodiment, the antenna comprises a metallic material and the reflector plate comprises another metallic material.

In yet another embodiment, the method further comprises:

forming an array of through substrate trenches through the semiconductor substrate; and forming an array of through substrate dielectric vias by filling the array of through substrate trenches with a dielectric material.

In still another embodiment, the semiconductor substrate comprises single crystalline silicon.

In a further embodiment, the antenna comprises:

a coaxially aligned pair of first antenna portions each having a first length; and a pair of second antenna portions having a constant separation distance, wherein each second antenna portion has a second length and is directly adjoined to an end of one of the first antenna portions.

In an even further embodiment, a spacing between the antenna and the reflector plate is from about 50 microns to about 750 microns.

In a yet further embodiment, the method further comprises:

forming at least one through substrate trench through the semiconductor substrate; and filling the at least one through substrate trench with a conductive material, wherein the at least one through substrate conductive via is formed by the conductive material.

In a still further embodiment, the method further comprises:

forming a metallic material layer directly on the at least one dielectric material layer; and lithographically patterning the metallic material layer, wherein remaining portions of the metallic material layer after the lithographic patterning constitutes an entirety of the antenna.

BRIEF DESCRIPTION OF THE DRAWINGS

FIGS. 1, 2A, 3A, 4, 5, 6, 7, 8, and 9A are vertical cross-sectional views. FIGS. 2B and 3B are top-down views of the first exemplary semiconductor structure at a step corresponding to FIGS. 2A and 3A, respectively. FIGS. 9B and 9D are horizontal cross-sectional views of the first exemplary semiconductor structure along the planes B-B' and D-D' of FIG. 9A, respectively. FIG. 9C is a bottom-up view of the first exemplary semiconductor structure of FIGS. 9A, 9B, and 9D.

FIG. 1 corresponds to a step after formation of a millimeter wave transceiver 62 on a semiconductor substrate 8. FIGS. 2A and 2B correspond to a step after deposition of at least one dielectric layer 70 and formation of a pair of metal interconnect structures 78. FIGS. 3A and 3B correspond to a step after formation of an antenna 100. FIG. 4 corresponds to a step after formation of a second dielectric layer 80. FIG. 5 corresponds to a step after flipping of the first exemplary semiconductor structure upside down and forming at least one through substrate trench 19. FIG. 6 corresponds to a step after formation of at least one through substrate conductive via 22. FIG. 7 corresponds to a step after formation of an array of through substrate trenches 29. FIG. 8 corresponds to a step after formation of an array of through substrate dielectric vias 30. FIGS. 9A-9D correspond to a step after formation of a reflector plate 200 and a second flipping of the first exemplary semiconductor structure.

DETAILED DESCRIPTION OF THE INVENTION

Figure 1:
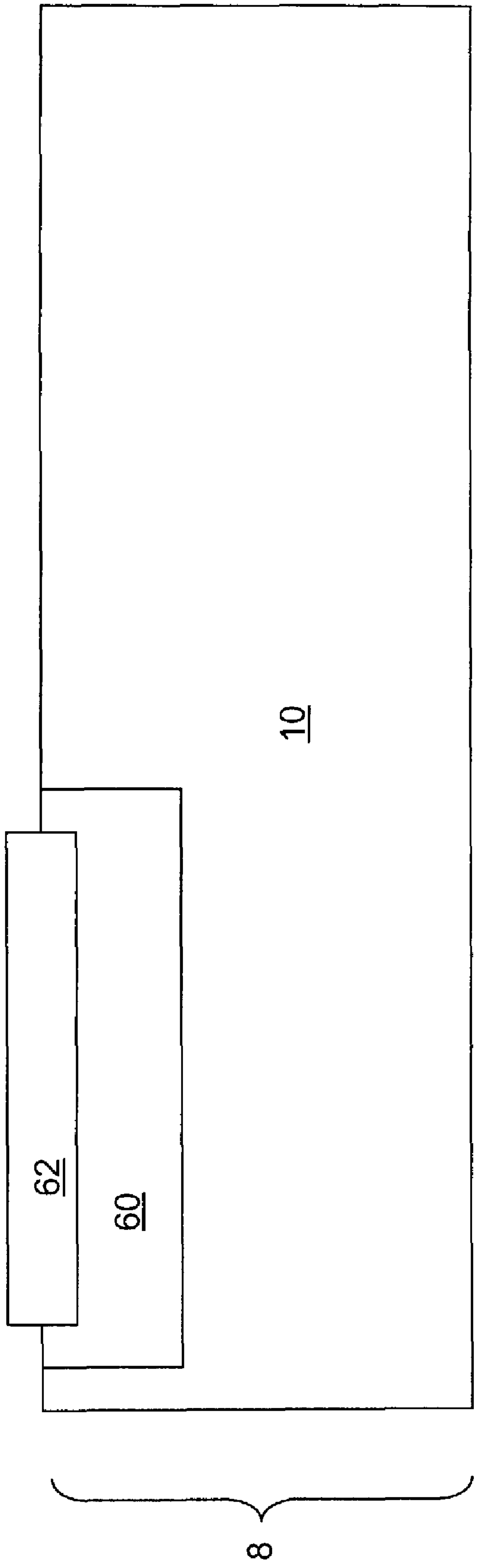
FIGS. 1, 2A, 2B, 3A, 3B, 4, 5, 6, 7, 8, 9A, 9B, 9C, 9D are various sequential views of a first exemplary semiconductor structure according to a first embodiment of the present invention. Figures with the same numeric label correspond to the same stage of manufacturing.

As stated above, the present invention relates to a semiconductor structure including an integrated millimeter wave antenna, a reflector plate, and a transceiver on a substrate, and methods of forming the same. As used herein, when introducing elements of the present invention or the preferred embodiments thereof, the articles “a”, “an”, “the” and “said” are intended to mean that there are one or more of the elements. Throughout the drawings, the same reference numerals or letters are used to designate like or equivalent elements. Detailed descriptions of known functions and constructions unnecessarily obscuring the subject matter of the present invention have been omitted for clarity. The drawings are not necessarily drawn to scale.

Referring to FIG. 1, a first exemplary semiconductor structure according to a first embodiment of the present invention comprises a semiconductor substrate 8, which includes a high resistivity semiconductor portion 10 and a low resistivity semiconductor portion 60. The high resistivity semiconductor portion 10 and the low resistivity semiconductor portion 60 comprise a single crystalline semiconductor material such as silicon, a silicon germanium alloy region, silicon, germanium, a silicon-germanium alloy region, a silicon carbon alloy region, a silicon-germanium-carbon alloy region, gallium arsenide, indium arsenide, indium gallium arsenide, indium phosphide, lead sulfide, other III-V compound semiconductor materials, and II-VI compound semiconductor materials. For example, the single crystalline semiconductor material may be silicon. Preferably, the entirety of the high resistivity semiconductor portion 10 and the low resistivity semiconductor portion 60 is single crystalline, i.e., has epitaxial atomic alignment.

The high resistivity semiconductor portion 10 has a resistivity greater than 20 Ohms-cm. Preferably, the high resistivity semiconductor portion 10 has a resistivity greater than 1 k Ohms-cm. As will be shown below, a region of the high resistivity semiconductor portion 10 is located between an antenna and a reflector plate, and the eddy current and the accompanying loss is inversely proportional to the resistivity of the semiconductor material in the high resistivity semiconductor portion 10. While silicon is used herein to illustrate the required dopant level for each threshold resistivity value for the high resistivity semiconductor portion 10, target dopant concentrations for other semiconductor materials may be readily obtained since each type of semiconductor material has a well established relationship between the dopant concentration and the resistivity of the semiconductor material.

While the present invention is described employing a bulk semiconductor substrate, in which the entirety of the high resistivity semiconductor portion 10 and a low resistivity semiconductor portion 60, use of alternative substrates such as a semiconductor-on-insulator (SOI) substrate, a hybrid substrate including an SOI portion and a bulk portion, and a substrate including a top semiconductor layer and a bottom insulator layer comprising a dielectric material such as silicon oxide or sapphire are also explicitly contemplated herein, which accompanying variations on the structures.

The low resistivity semiconductor portion 60 has a resistivity less than 5 Ohm-cm. The low resistivity semiconductor portion 60 may have a doping of the same conductivity type as the high resistivity semiconductor portion 10, or may have a doping of the opposite conductivity type as the high resistivity semiconductor portion 10. In case the low resistivity semiconductor portion 60 has a doping of the opposite conductivity type as the high resistivity semiconductor portion 10, a reverse biased p-n junction may be formed at the interface between the low resistivity semiconductor portion 60 and the high resistivity semiconductor portion 10 to provide electrical isolation. In case the low resistivity semiconductor portion 60 has the same conductivity type doping as the high resistivity semiconductor portion 10, additional well or isolation trenches may be formed within the low resistivity semiconductor portion 60 to provide electrical isolation of devices to be subsequently formed on the low resistivity semiconductor portion 60. The low resistivity semiconductor portion 60 may include a portion having a p-type doping and another portion having an n-type doping. Deep trench isolation and/or shallow trench isolation as well as multiple well structures may be employed within the low resistivity semiconductor portion 60 to provide electrical isolation to the devices to be subsequently formed thereupon.

The low resistivity semiconductor portion 60 provides suitably doped semiconductor material for forming semiconductor devices such as field effect transistors, bipolar transistors, diodes, varactors, capacitors, resistors, etc. Since the dopant concentration of the high resistivity semiconductor portion 10 is lower than the dopant concentration of the low resistivity semiconductor portion 60, the low resistivity semiconductor portion 60 may be formed from a region of the high resistivity semiconductor portion 10 by masked ion implantation. For example, the entirety of the semiconductor substrate 8 may be a high resistivity semiconductor portion 10, and masked ion implantation into a region on the front surface, or the top surface, of the semiconductor substrate may be employed to form a low resistivity semiconductor portion 60.

A millimeter wave transducer 62 is formed on the front surface of the low resistivity semiconductor portion 60. The millimeter wave transducer 62 converts electromagnetic wave captured by an antenna into an electrical signal for semiconductor devices and/or concerts an electrical signal from semiconductor devices into an electromagnetic wave signal to be broadcast through an antenna. The frequency of the electromagnetic wave and the electrical signals is in the range from about 30 GHz to about 300 GHz. In this frequency range, the wavelength of the electromagnetic radiation in vacuum corresponding to the electromagnetic wave is from about 1 mm to about 10 mm, i.e., in the millimeter range.

Semiconductor devices (not shown) that processes electrical signals from and/or to the millimeter wave transducer 62 are also formed on the front surface of the semiconductor substrate. The millimeter wave transducer 62 and the semiconductor devices may be formed employing front-end-of-line processes known in the art. The millimeter wave transducer 62 and the semiconductor devices may optionally include some back-end-of-line structures such as a metal interconnect structure. The millimeter wave transducer 62 and the semiconductor devices on the front surface of the semiconductor substrate 8 may include various metal semiconductor alloy regions such as metal silicides.

Figure 2A:
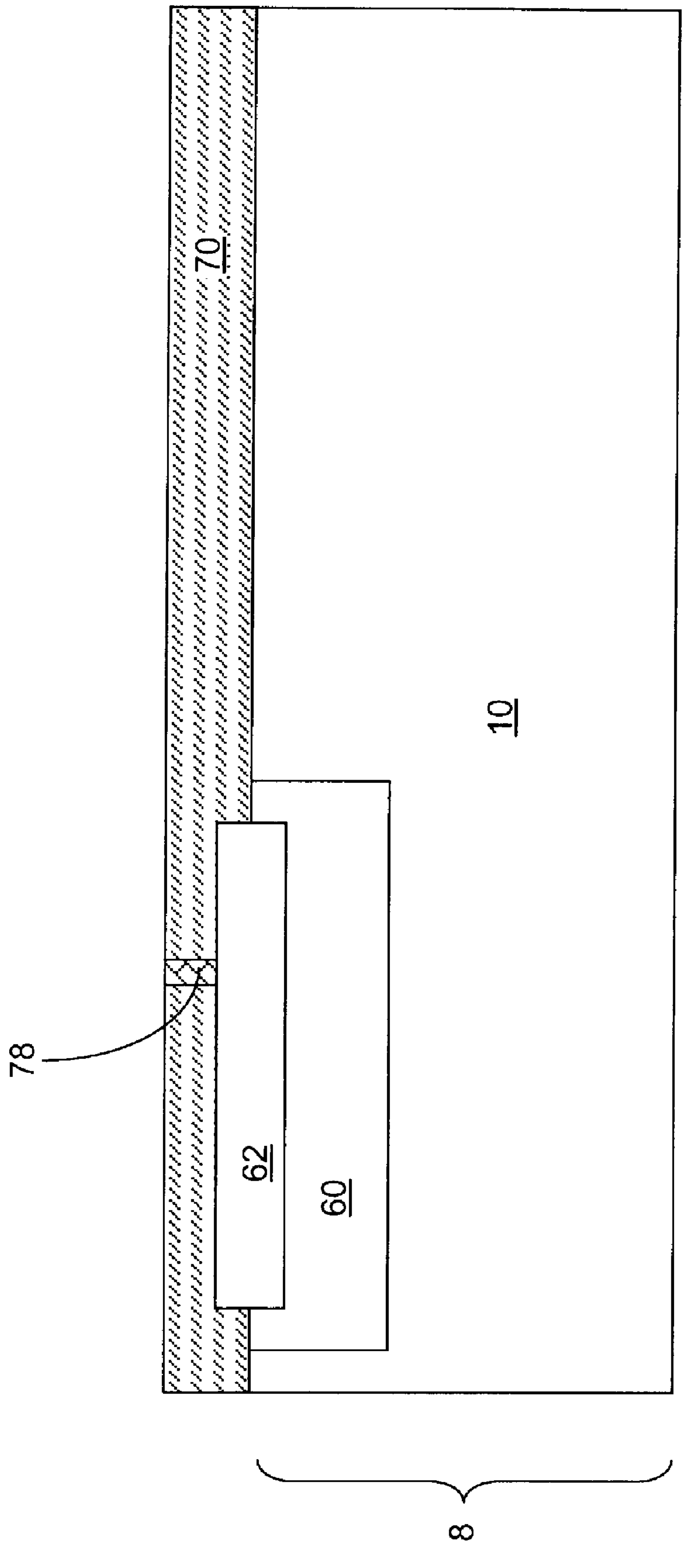
Figure 2B:
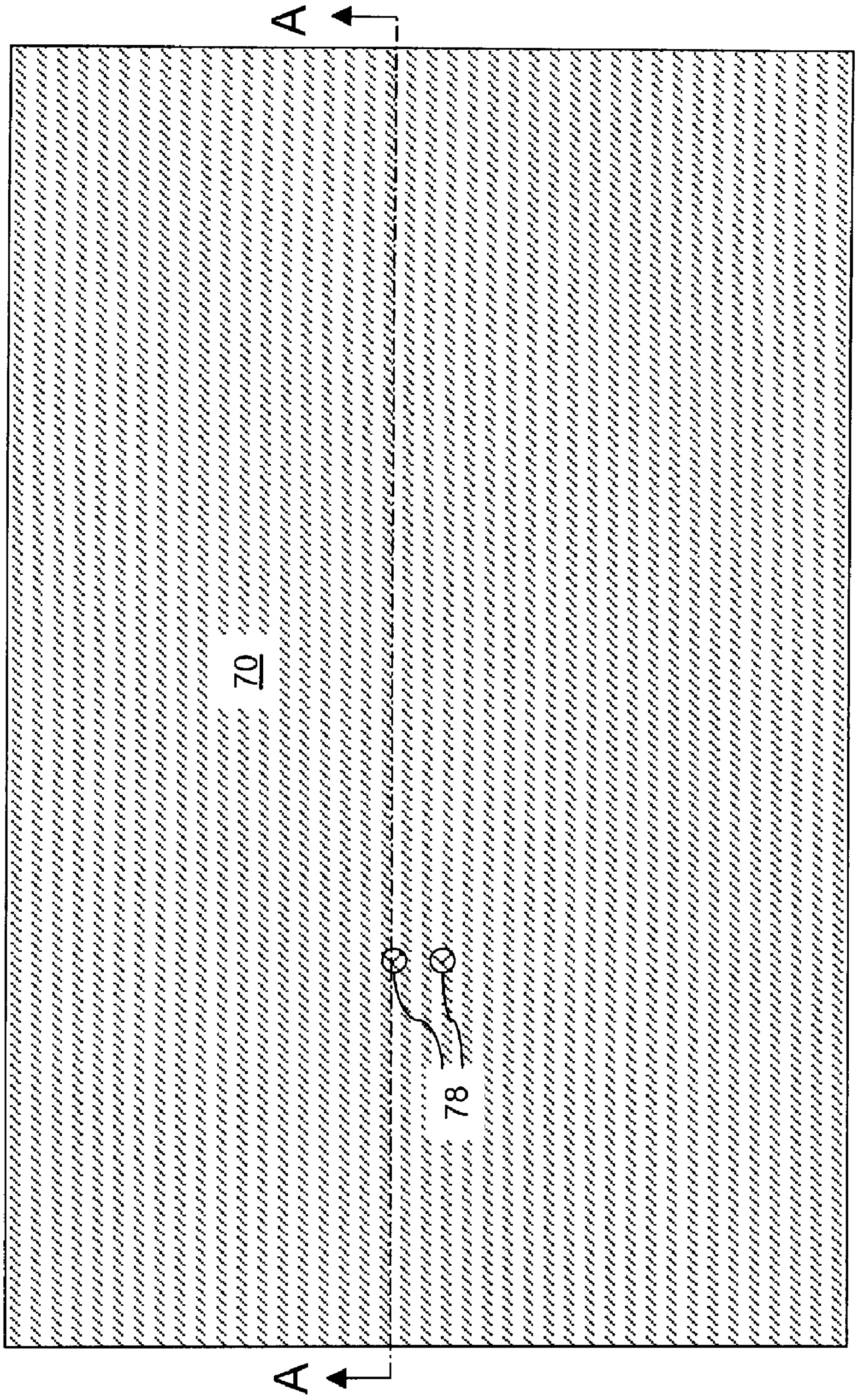

Referring to FIGS. 2A and 2B, at least one dielectric layer 70 is formed directly on the front surfaces of the first exemplary semiconductor structure including the top surface of the millimeter wave transducer 62 and other semiconductor devices (not shown). The at least one dielectric layer 70 may include a middle-of-line (MOL) dielectric layer, at least one back-end-of-line (BEOL) via level dielectric layer, and/or at least one BEOL line level dielectric layer. The at least one dielectric layer 70 may include a stack of multiple BEOL via level dielectric layers and multiple BEOL line level dielectric layers. The at least one dielectric layer 70 may comprise silicon oxide, silicon nitride, silicon oxynitride, an organosilicate glass (OSG), low-k chemical vapor deposition (CVD) oxide, a self-planarizing material such as a spin-on glass (SOG), and/or a spin-on low-k dielectric material such as SiLK™. Exemplary silicon oxides include undoped silicate glass (USG), borosilicate glass (BSG), phosphosilicate glass (PSG), fluorosilicate glass (FSG), borophosphosilicate glass (BPSG), or a combination thereof. The total thickness of the at least one dielectric layer may be from about 100 nm to about 10,000 nm, and typically from about 200 nm to about 5,000 nm.

A pair of metal interconnect structures 78 that is electrically, i.e., resistively, connected to the millimeter wave transducer 61 is formed in the at least one dielectric layer 70. Each metal interconnect structure 78 comprises at least one conductive via, and may optionally include additional conductive via(s) and/or at least one metal line structure. The number of conductive via(s) and the optional at least one metal line structure in the at least one dielectric layer 70 depends on the number of via levels and wiring levels within the at least one dielectric layer 70. Preferably, the impedance of each component of each of the pair of metal interconnect structures 78 is matched to minimize reflection at interfaces between different components, i.e., at interfaces between a conductive via and a conductive line. Other metal interconnect structures (not shown) including other conductive vias and other conductive metal lines may be formed within the at least one dielectric layer 70 on the millimeter wave transducer 62 and the other semiconductor devices (not shown). Preferably, the top surface of the at least one dielectric layer 70 is planar, which may be effected by planarization such as chemical mechanical planarization (CMP).

Figure 3A:
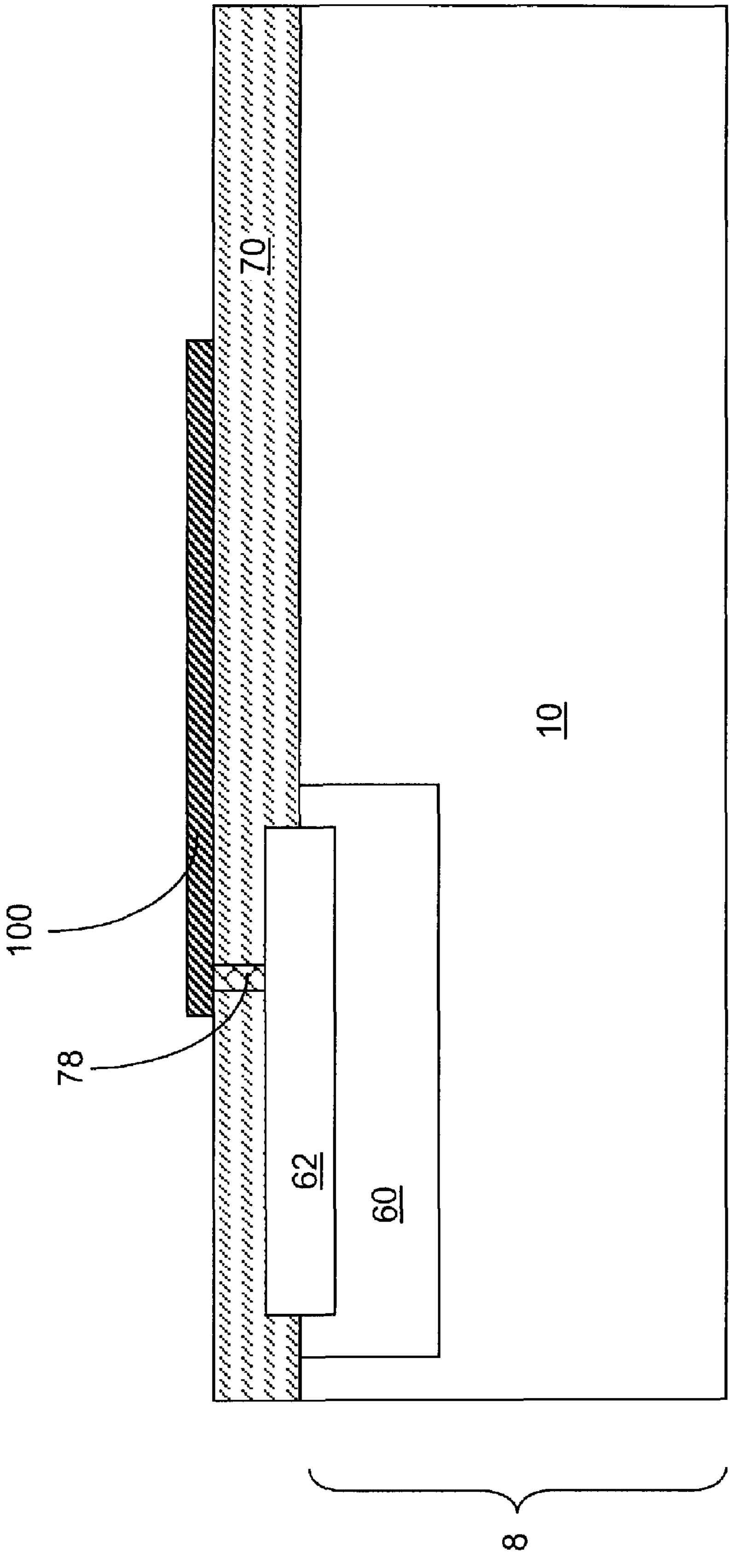
Figure 3B:
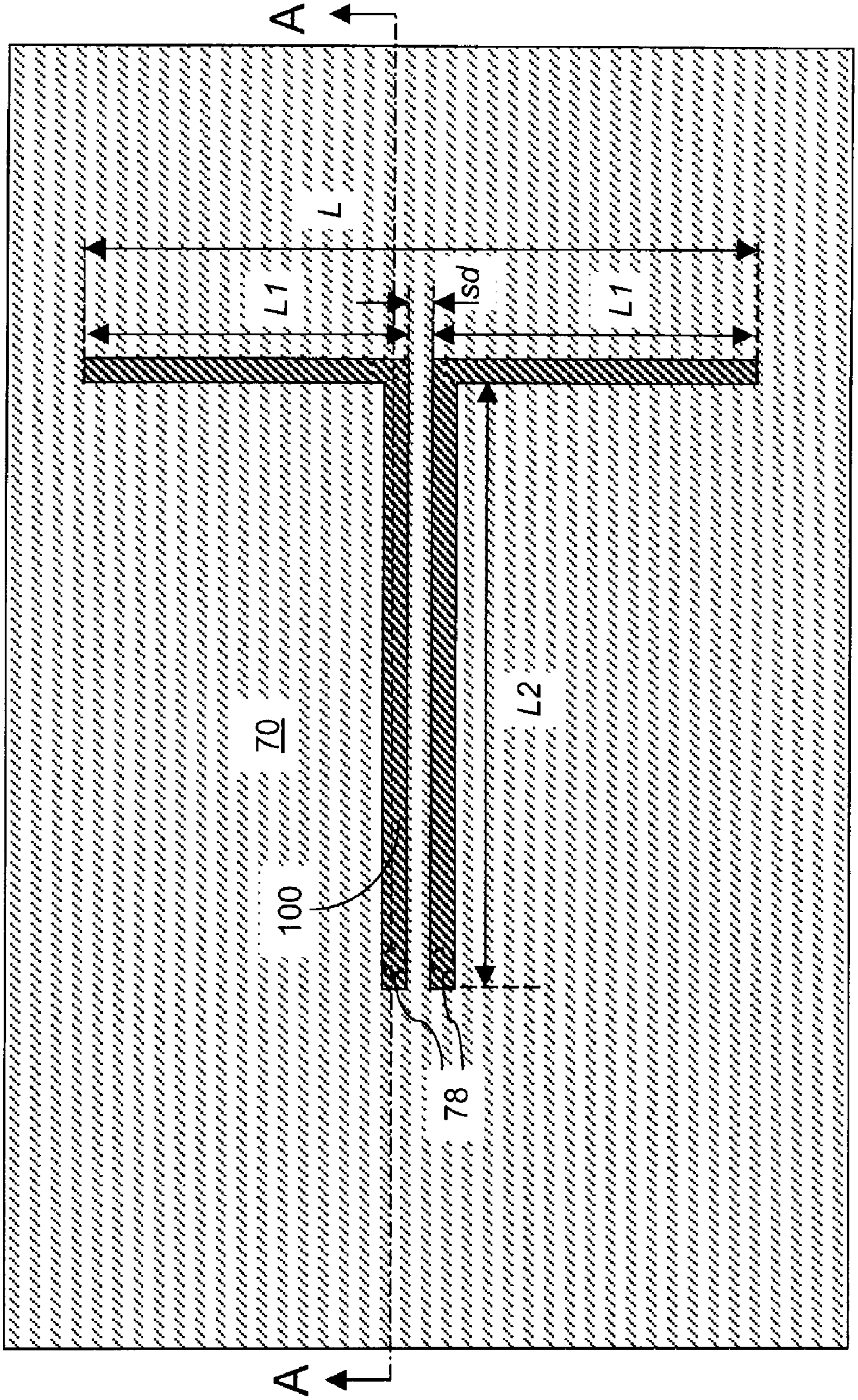

Referring to FIGS. 3A and 3B, a metallic material layer is formed directly on the exposed top surface of the at least one dielectric layer 70, and is lithographically patterned to form an antenna 100. A photoresist layer (not shown) may be applied over the top surface of the metallic material layer, and lithographically patterned in the shape of an antenna. The pattern in the photoresist is transferred into the metallic material layer by an etch, which may be an anisotropic etch such as a reactive ion etch or an isotropic etch such as a wet etch employing the remaining portions of the photoresist layer as an etch mask.

The metallic material layer may comprise an elemental metal, a metal alloy, a conductive metallic compound, or a combination thereof. Elemental metals include transition metals, Lanthanides, Actinides, alkali metals, alkaline-earth metals, Group III A metals, Group IV A metals, Group V A metals, and Group VI A metals. Metal alloys include an alloy of at least two of the elemental metals. A conductive metallic compound is a conductive compound of at least one metal and at least one non-metallic element such as TaN, TiN, WN, etc. For example, the metallic material layer may comprise Cu, Al, or W.

The vertical thickness of the antenna 100, which is typically substantially the same as the thickness of the metallic material layer, may be from about 0.2 micron to about 10 microns, and typically from about 1 micron to about 5 microns, although lesser and greater thicknesses are also contemplated herein. The antenna 100 has a width from about 0.2 micron to about 10 microns, and typically from about 1 micron to about 5 microns, although lesser and greater thicknesses are also contemplated herein. Preferably, the entirety of the antenna 100 has the same width and the same thickness to insure than the impedance per unit of length remains the same, thereby minimizing internal reflection of waves. In other words, the entirety of the antenna 100 is impedance matched for optimal signal transmission or capture.

The antenna 100 includes a coaxially aligned pair of first antenna portions and a pair of second antenna portions separated by a constant separation distance sd. Each of the first antenna portions has a constant width, which may be from about 10 microns to about 30 microns, and typically from about 1 micron to about 50 microns, although lesser and greater widths are also contemplated herein. Each of the first antenna portions has a first length L1, which may be from about 30 microns to about 1,000 microns, although lesser and greater first lengths L1 are also contemplated herein. The separation distance sd may be from about 0.1 micron to about 30 microns, and, although lesser and greater separation distances are also contemplated herein. The length L of the antenna is the sum of twice the first length L1 and the separation distance sd, and is about a quarter wavelength, $\lambda/4$, of the electromagnetic signal that the antenna 100 is designed to transmit and/or capture, wherein $\lambda$ is the full wavelength of the electromagnetic signal.

The full wavelength $\lambda$ of the electromagnetic signal refers to the full wavelength in a dielectric medium, i.e., within the material of the at least one dielectric layer 70 and other surrounding dielectric materials that affects the effective permittivity of the overall dielectric medium in which the antenna 100 is located. The permittivity of a material is the product of a relative permittivity, which is also referred to as a dielectric constant, and the permittivity of the vacuum $\epsilon_0$. The wavelength of electromagnetic radiation in a medium is equal to the wavelength of the electromagnetic radiation in vacuum having the same frequency divided by the square root of the relative permittivity of the medium. For example, if the antenna 100 is embedded in silicon oxide having a dielectric constant of about 3.9, the quarter wavelength of electromagnetic radiation, and consequently, the target dimension for the length L of the antenna, is the same as the quarter wavelength in vacuum divided by the square root of the dielectric constant of the medium, i.e., 3.9.

For millimeter waves, the quarter wavelength in vacuum is from about 250 microns to about 2,500 microns. Assuming a dielectric constant range from about 2.5, which is about the dielectric constant of a porous low-k chemical vapor deposition (CVD) oxide, to about 8.0, which is the dielectric constant of silicon nitride, the range of the quarter wavelength in a typical back-end-of-line (BEOL) dielectric layers may be from about 80 microns to about 1,600 microns. Thus, the target dimension for the length L of the antenna is also from about 80 microns to about 1,600 microns.

The pair of second antenna portions runs parallel to each other. Each of the second antenna portions has a second length L2, which may be from about 1 micron to about 1,000 microns, and typically from about 200 microns to about 500 microns, although lesser and greater second lengths L2 are also contemplated herein. One end of each of the second antenna portions laterally abuts, and is directly adjoined to, a proximal end of a first antenna portion. The proximal end is the end of an first antenna portion that is closer to the other first antenna portion than the opposite end, which is herein referred to a distal end. The length L of the antenna is the distance between the two distal ends of the two first antenna portions, and the separation distance sd is the distance of between the two proximal ends of the two first antenna portions.

Each of the second antenna portions is connected to the one of the pair of metal interconnect structures 78 near an end located on an opposite side of the end that abuts a first antenna portion. The pair of metal interconnect structures 78 vertically abuts the antenna 100. The location of the pair of metal interconnect structures 78, which underlies the second antenna portion of the antenna 100, is marked in dotted circles in FIG. 3B. Preferably, the impedance of the pair of metal interconnect structures 78 is matched to the impedance of the antenna to minimize reflection of electromagnetic signal transmission from and the antenna 100 to the millimeter wave transceiver 62.

Figure 4:
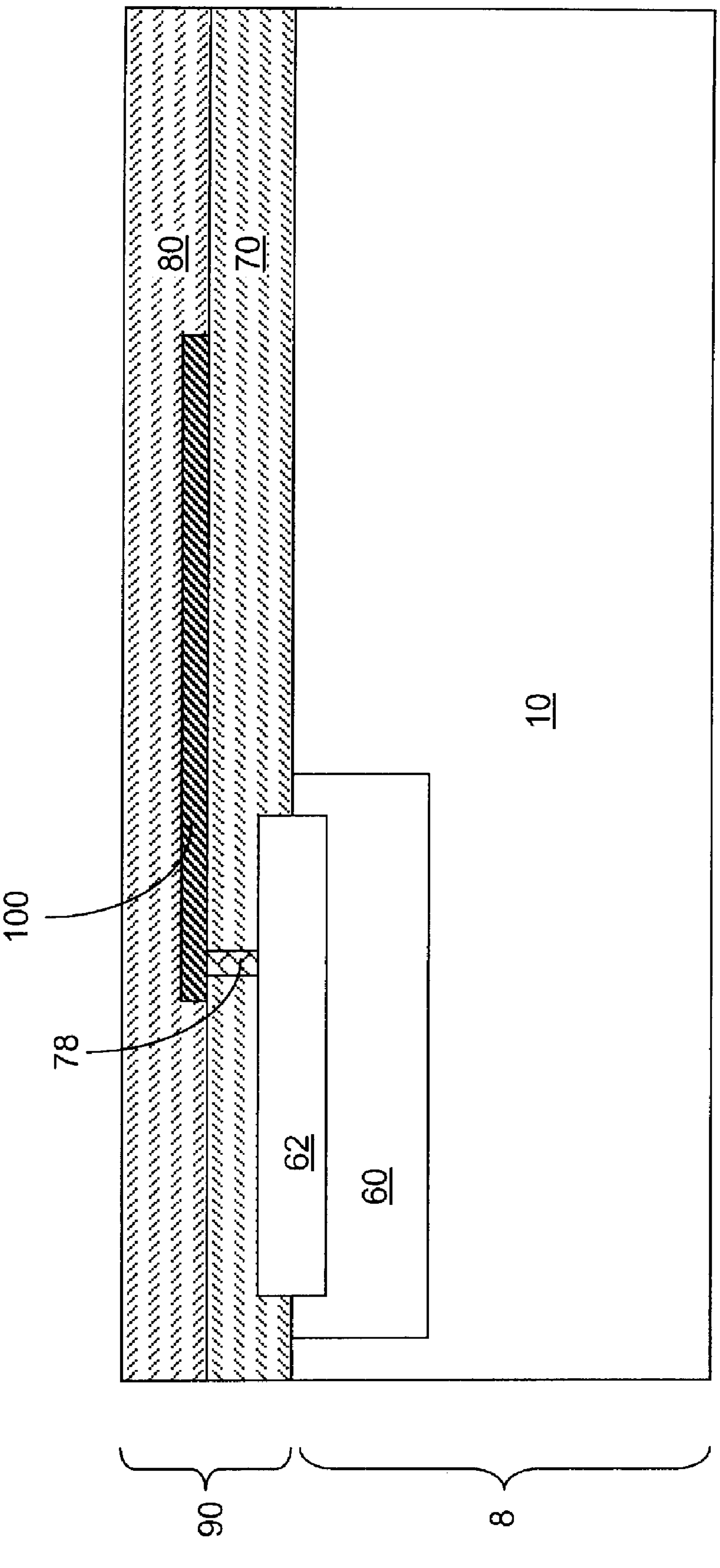

Referring to FIG. 4, another dielectric material layer 80 may be formed on the antenna 100 and the exposed surfaces of the at least one dielectric material layer 70. The other dielectric material layer 80 may comprise the same type of material as the materials described above for the at least one dielectric material layer 70. The other dielectric material layer 80 is optional, and embodiments in which the other dielectric material layer 80 is omitted are also contemplated herein.

In case the other dielectric material layer 80 is formed over the antenna 100 and the at least one dielectric material layer 80, the antenna 100 is encapsulated by the at least one dielectric material layer 70, the pair of metal interconnect structures 78 embedded therein, and the other dielectric material layer 80. The thickness of the other dielectric material layer 80 may be from about 1 micron to about 20 microns, and typically from about 2 microns to about 10 microns, although lesser and greater thicknesses are also contemplated herein. The other dielectric material layer 80 provides the benefit of reducing the wavelength of the electromagnetic signal to be captured by the antenna by a factor on the order of the relative permittivity, i.e., the dielectric constant, of the material of the other dielectric material layer 80.

The at least one dielectric material layer 70 and the other dielectric layer 80 are collectively called a back-end-of-line (BEOL) dielectric stack 90. Other metal interconnect structures (not shown) may be formed in the BEOL dielectric stack 90. Further, C4 pads (not shown) or wirebond pads (not shown) may be formed on the front surface, i.e., the top surface, of the BEOL dielectric stack 90 to enable electrical connection of the first exemplary semiconductor structure, which is a semiconductor chip, to other structures such as a chip package.

Figure 5:
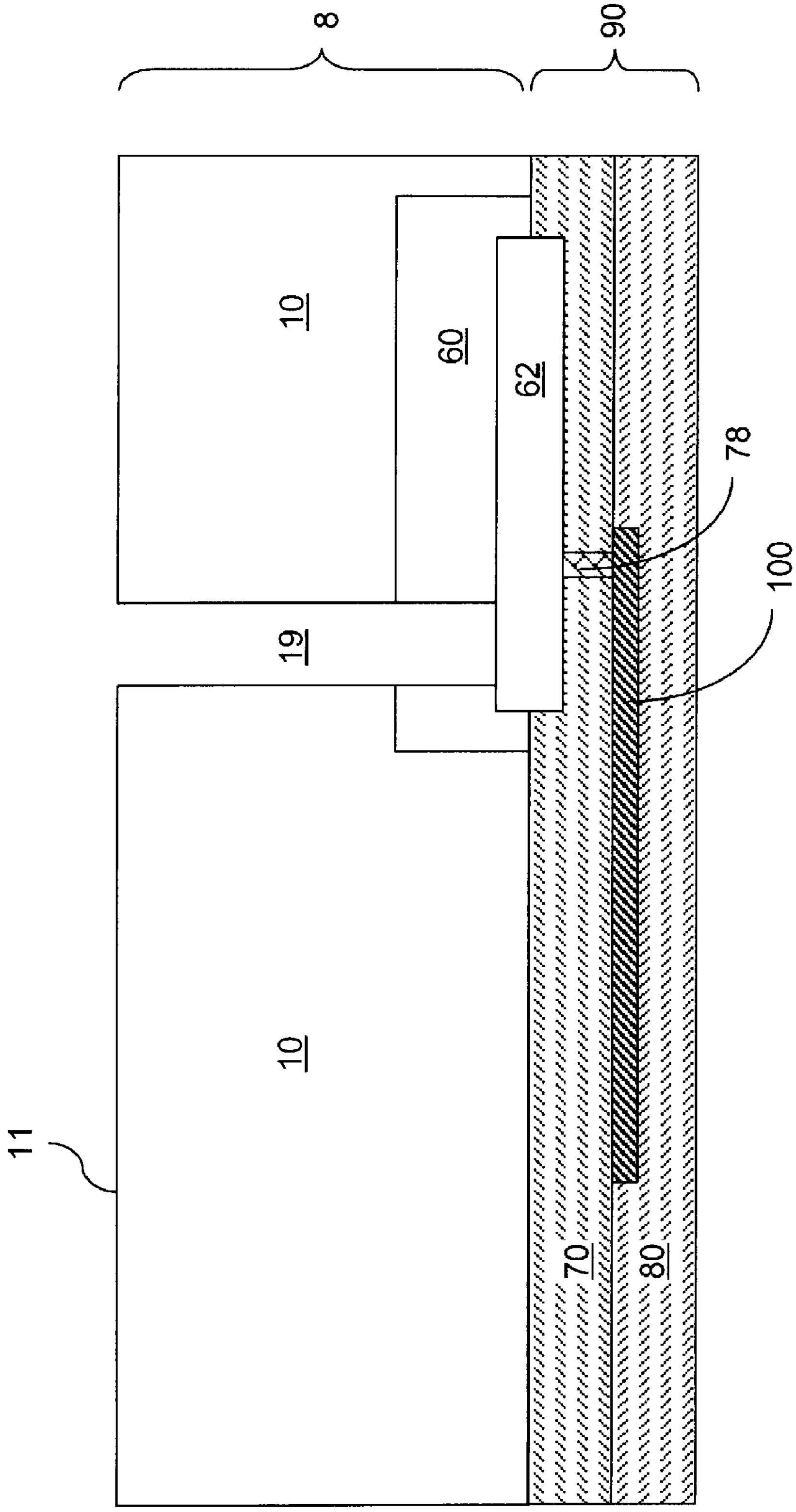

Referring to FIG. 5, the first exemplary semiconductor structure is flipped upside down to place a back surface 11 of the semiconductor substrate 8 on the top. At least one through substrate via 19 is formed in a region of the high resistivity semiconductor portion 10 that overlie the millimeter wave transducer 62. The at least one through substrate via 19 is formed through the high resistivity semiconductor portion 10 and the low resistivity semiconductor portion 60 and exposes a conductive connection component (not shown) in the millimeter wave transducer 62. The conductive connection component may be connected to electrical ground of the circuit of the millimeter wave transducer 62.

Formation of the at least one through substrate trench 19 may be effected by patterning a masking layer (not shown) on the bottom surface of the substrate 8 (which is now located above the body of the semiconductor substrate 8) and lithographically patterning the masking layer. The pattern in the masking layer is transferred through the semiconductor substrate 8 by an anisotropic etch. The masking layer may be a hard mask layer that may be patterned with a photoresist and a pattern transfer by an etch, or a photoresist layer that may be directly patterned with lithographic methods.

Optionally, the semiconductor substrate 8 may be thinned, for example, by chemical mechanical polishing (CMP), grinding, a chemical etch, cleaving, or other methods. The thickness of the semiconductor substrate prior to thinning may be from about 400 microns to about 750 microns. If the semiconductor substrate 8 is thinned, the thickness of the semiconductor substrate 8 may be reduced to a thickness about 50 microns to about 150 microns.

The lateral dimensions of the at least one through substrate trench 19 may be from about 2 microns to about 100 microns, although lesser and greater dimensions are also contemplated herein. A horizontal cross-sectional area of the at least one through substrate trench 19 may include a rectangular shape or an elongated ellipsoidal shape. Typically, sidewalls of the at least one through substrate trench 19 by a dimension on the order of 2 microns to about 10 microns to facilitate filling of the at least one through substrate trench 19 with a conductive material in a subsequent step.

While the present invention is described with a processing scheme that forms the at least one through substrate trench 19 after formation of the antenna 100 and the BEOL dielectric stack 90, embodiments in which the at least one through substrate trench 19 is formed prior to formation of the antenna 100 and the BEOL dielectric stack 90 are explicitly contemplated herein.

Figure 6:
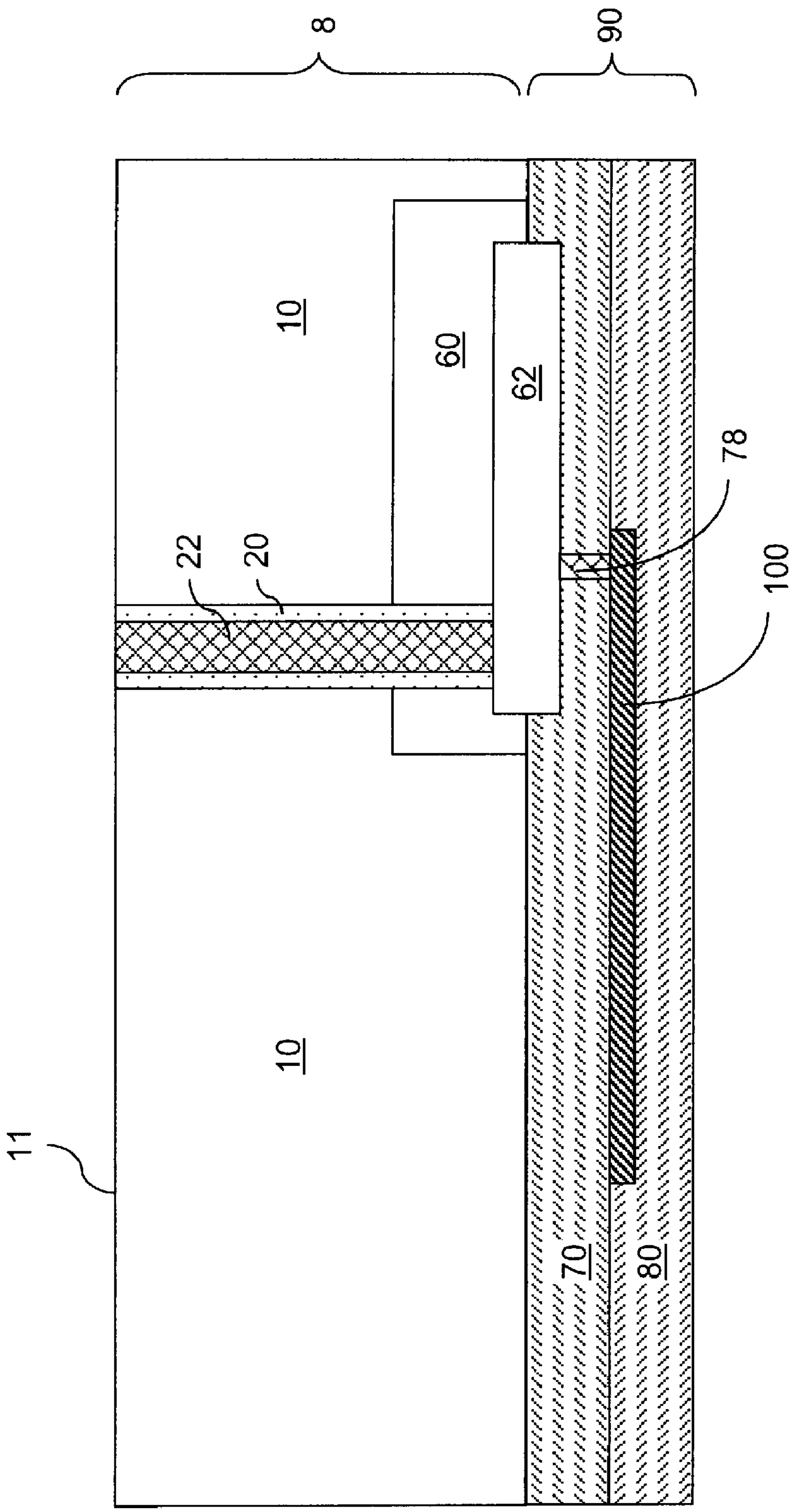

Referring to FIG. 6, a dielectric liner 20 may be formed on the sidewalls of the at least one through substrate trench 19, for example, by a conformal deposition of a dielectric material, followed by an anisotropic etch that removed horizontal portions of the dielectric material. The dielectric liner 20 is optional, i.e., may, or may not, be formed. In case the high resistivity semiconductor portion 10 has sufficiently high resistivity to effectively function as an insulating material, the dielectric liner 20 may be omitted.

At least one through substrate conductive via 22 is formed in the remaining cavity of the at least one through substrate trench 19 by deposition of a conducive material by chemical vapor deposition (CVD), physical vapor deposition (PVD), electroplating, electroless plating, or a combination thereof. Excess conductive material on the back surface 11 of the substrate 8 is removed by a recess etch, chemical mechanical planarization (CMP), or a combination thereof. The at least one through substrate conductive via 22 provide an electrically conductive path between the back surface 11 of the semiconductor substrate 8 and the millimeter wave transceiver 62.

Figure 7:
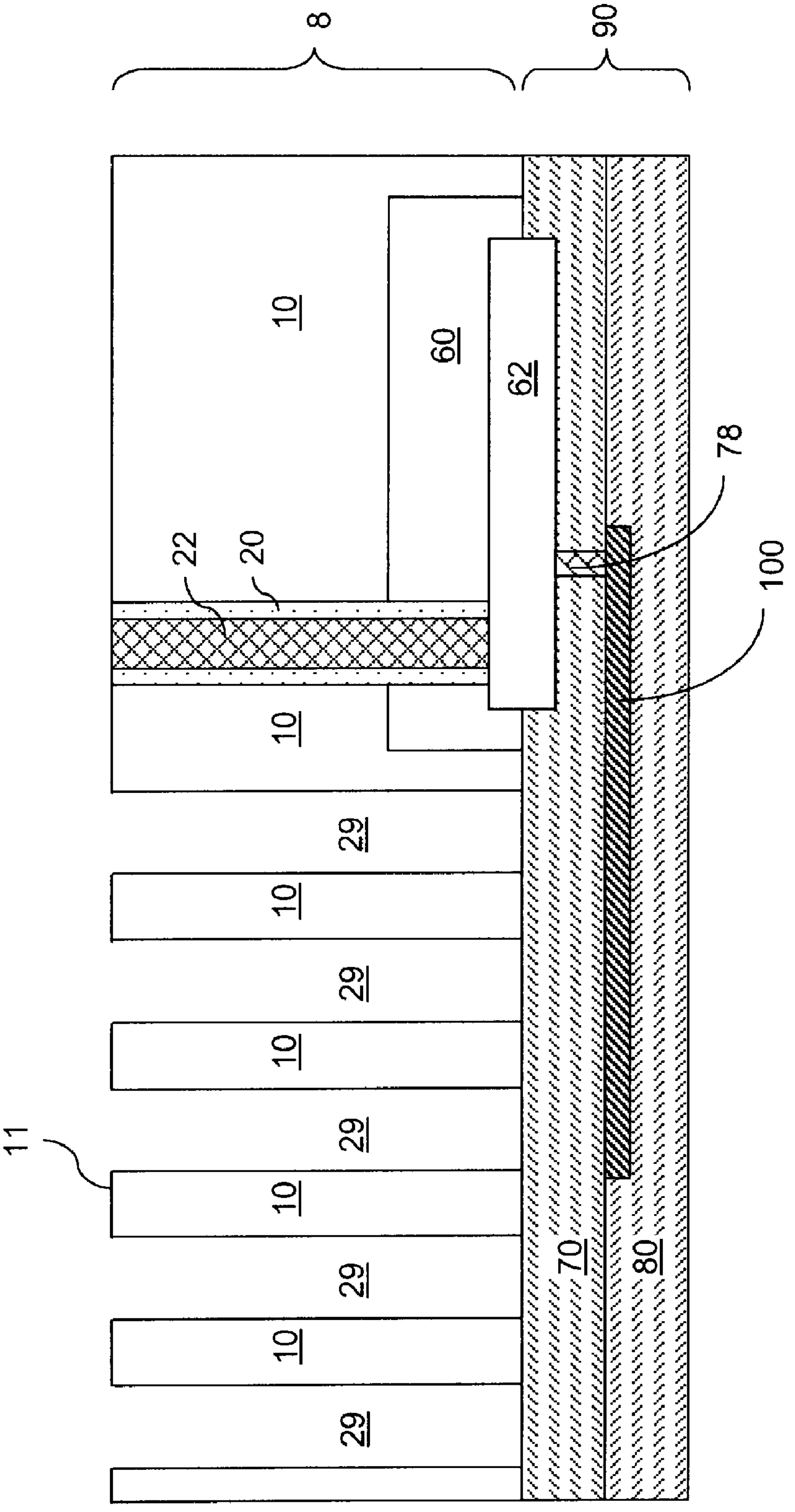

Referring to FIG. 7, an array of through substrate trenches 29 is formed in the semiconductor substrate 8. Specifically, the array of through substrate trenches 29 is formed in a region of the high resistivity semiconductor portion 10 that does not overlie the low resistivity semiconductor portion 60. Thus, the entirety of the sidewalls of the array of the through substrate trenches 29 have high resistivity semiconductor materials from the high resistivity semiconductor portion 10.

The lateral dimensions of each through substrate trench in the array of through substrate trenches 29 may be from about 2 microns to about 100 microns, although lesser and greater dimensions are also contemplated herein. Each through substrate trenches may have a horizontal cross-sectional shape that is a rectangle or an elongated ellipsoid. Typically, sidewalls of each through substrate trench 29 are separated by a dimension on the order of 2 microns to about 10 microns to facilitate filling of the array of through substrate trenches 29 with a dielectric material in a subsequent step.

Figure 8:
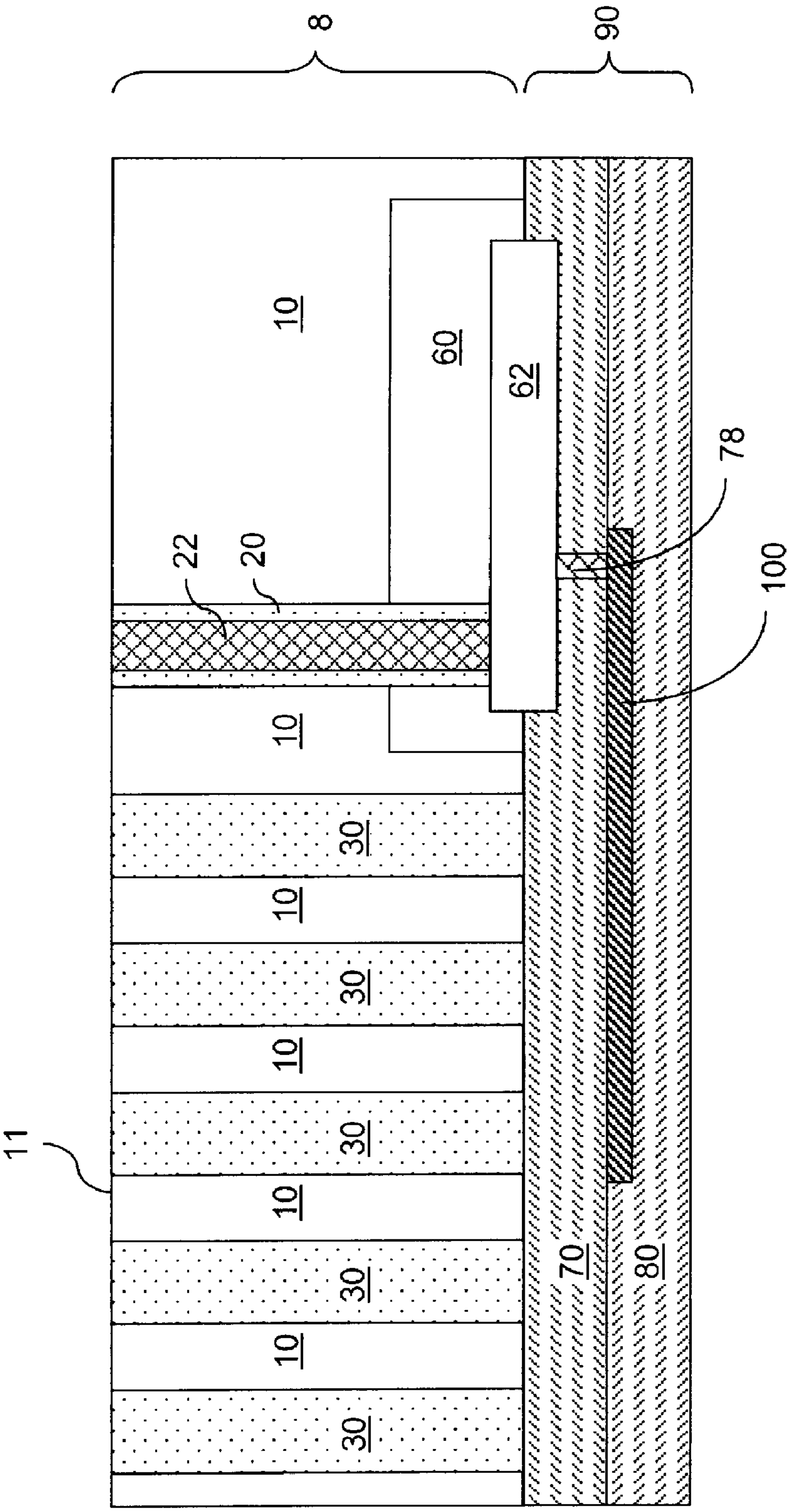

Referring to FIG. 8, the array of through substrate trenches 29 is filled by a conformal deposition of a dielectric material, for example, by chemical vapor deposition (CVD) or a spin-on coating. The excess dielectric material on the back surface 11 of the semiconductor substrate 8 is removed by recess etch or chemical mechanical planarization (CMP). The remaining portions of the dielectric material filling the array of the through substrate trenches 29 constitutes an array of through substrate dielectric vias 30.

The dielectric material has a dielectric constant less than the dielectric constant of the semiconductor material in the high resistivity semiconductor portion 10. In case the high resistivity semiconductor portion 10 comprises silicon, the dielectric constant of the high resistivity semiconductor portion 10 is about 11.9 at a frequency range from about 30 GHz to about 300 GHz. In one embodiment, the dielectric material may comprise silicon nitride having a dielectric constant of about 7.5. In another embodiment, the dielectric material has a dielectric constant less than 4.0. For example, the dielectric material may be silicon oxide, which has a dielectric constant of about 3.9. Alternatively, the dielectric material may be an organosilicate glass (OSG), low-k chemical vapor deposition (CVD) oxide, or a spin-on low-k dielectric material such as SiLK™, which has a dielectric constant less than 3.0. The dielectric material may be a porous low-k dielectric material.

The effect of the array of through substrate dielectric vias 30 is to lower the effective dielectric constant of the region including the array of through substrate dielectric vias 30 and the sub-portion, or a matrix, of the high resistivity semiconductor portion 10 that embeds the array of through substrate dielectric vias 30. Thus, the lower the dielectric constant of the array of through substrate dielectric vias 30, the lower the effective dielectric constant of the region including the array of through substrate dielectric vias 30. As described below, the sum of the thickness of the substrate 8 and the thickness of the at least one dielectric layer 70 is about a quarter wavelength of the electromagnetic signal to be captured and/or transmitted by the antenna. A low effective dielectric constant for the region including the array of through substrate dielectric vias 30 allows less thinning of the semiconductor substrate 8, or even elimination of thinning of the semiconductor substrate 8.

Figure 9A:
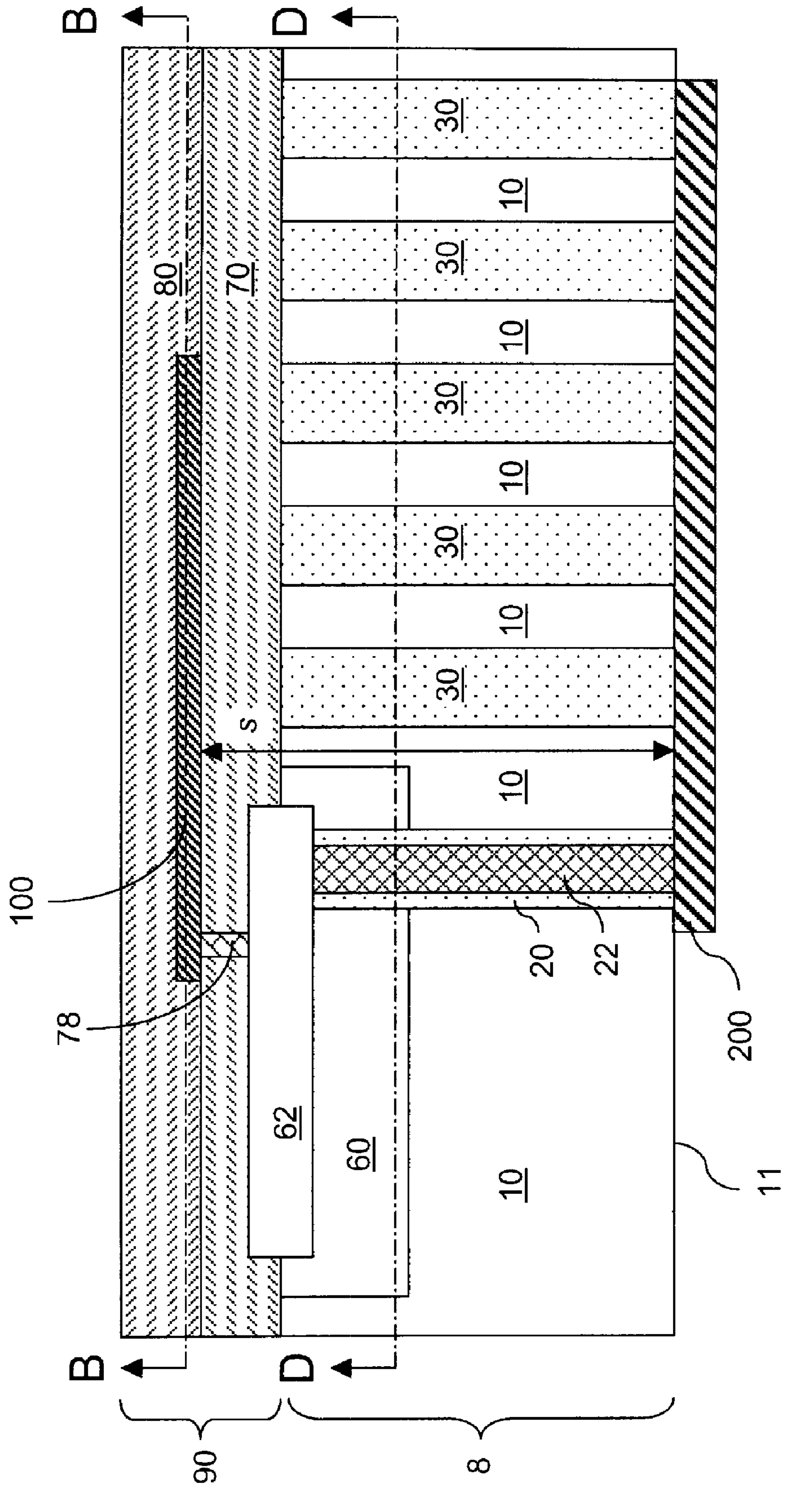
Figure 9B:
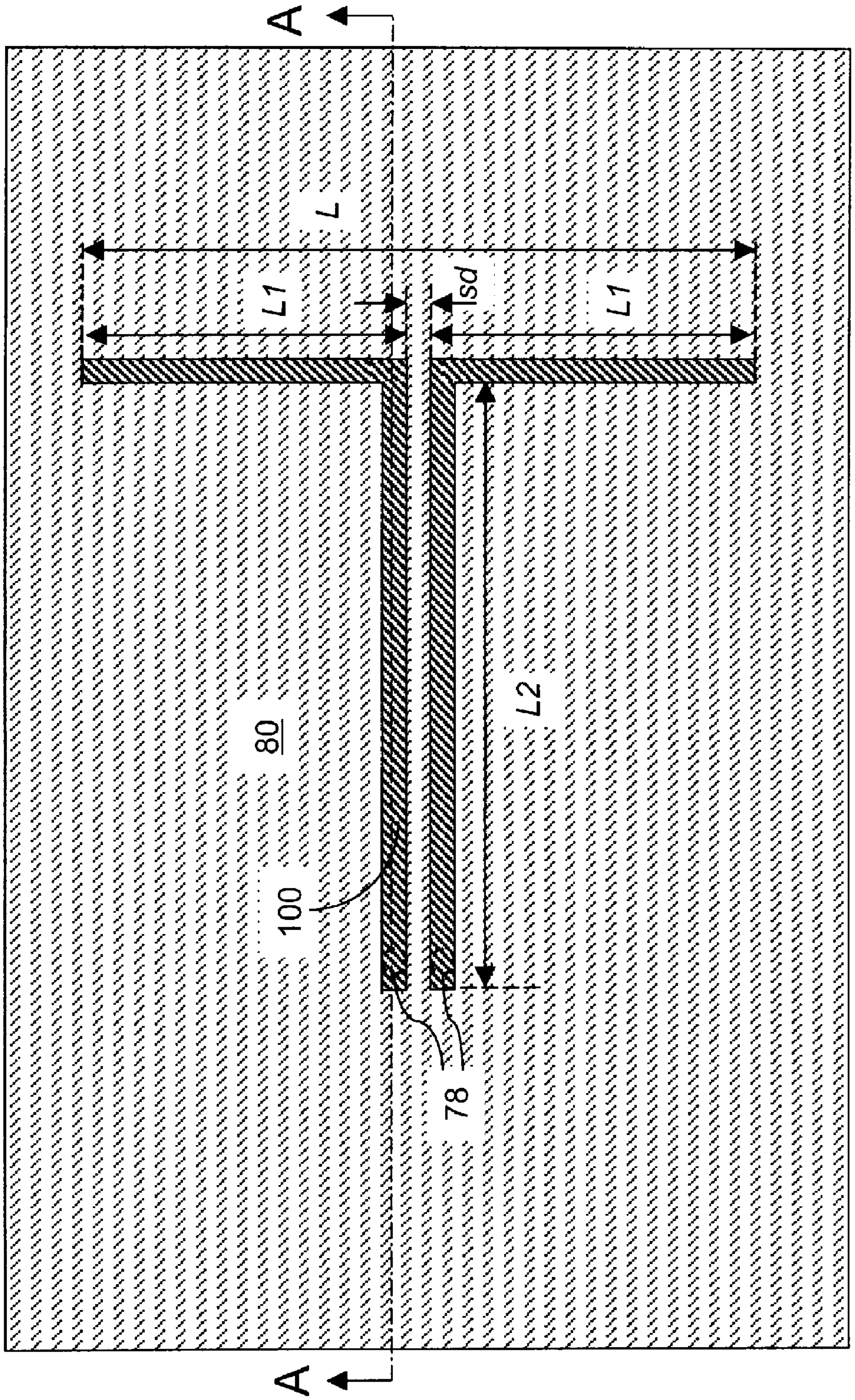
Figure 9C:
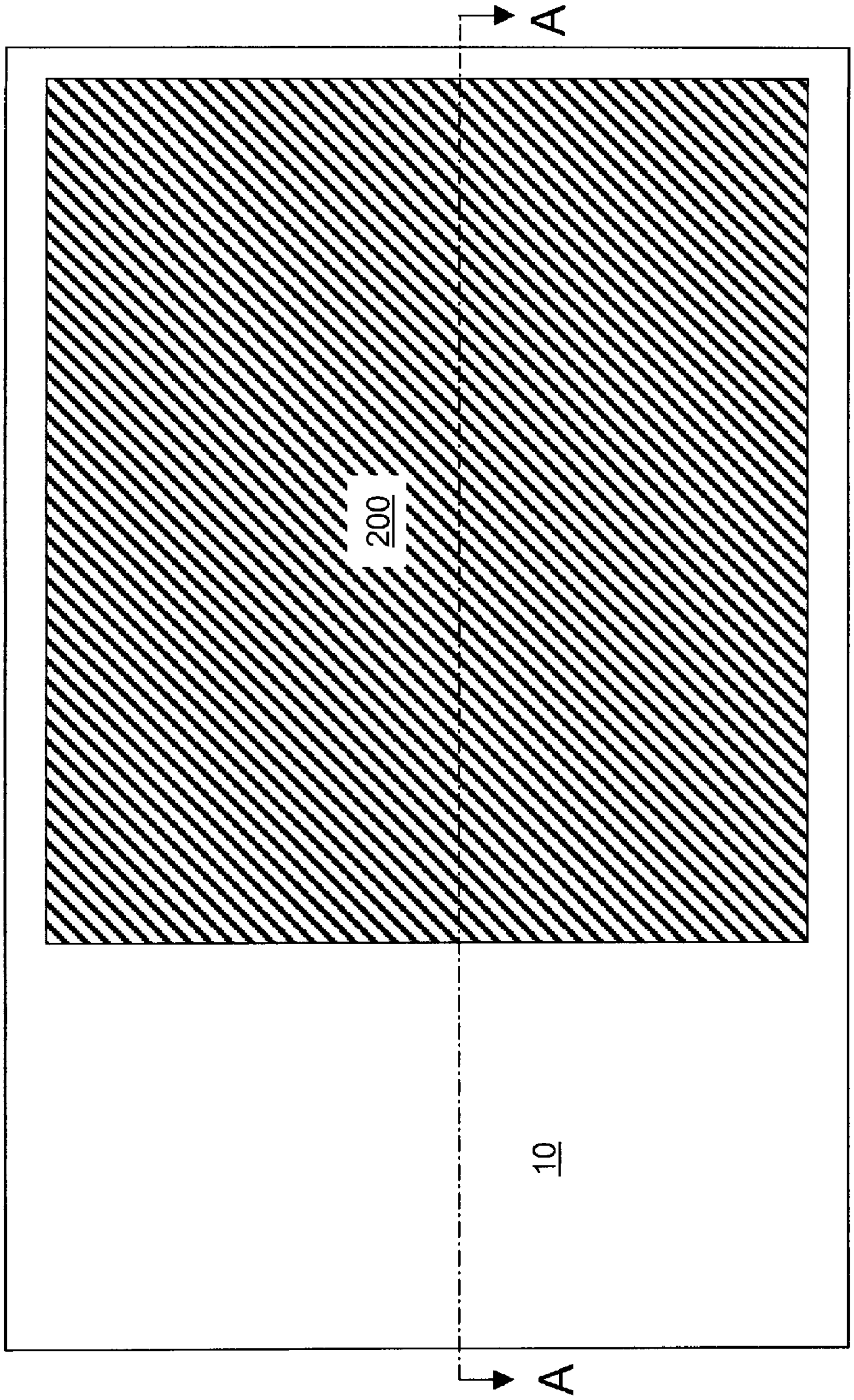
Figure 9D:
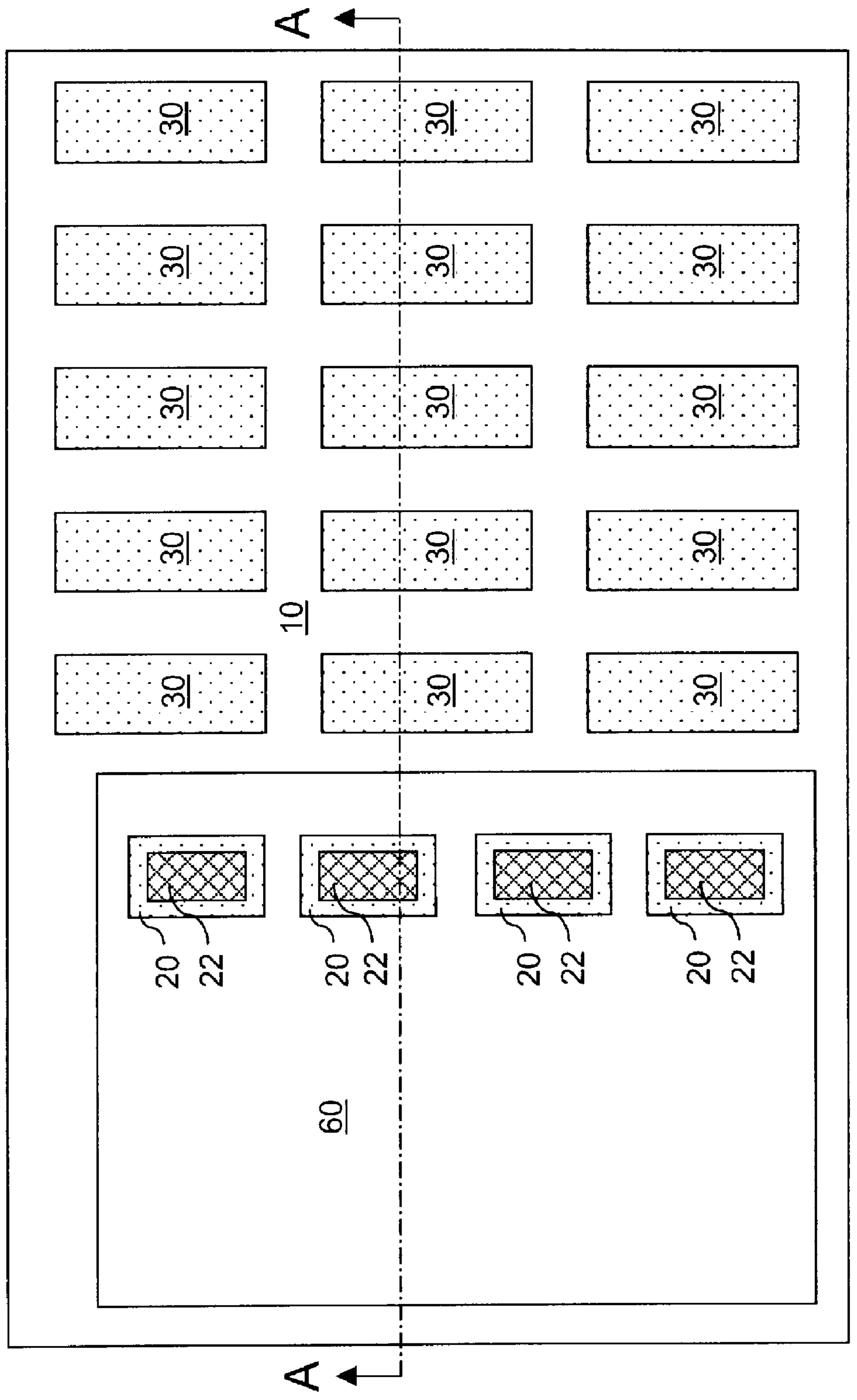

Referring to FIGS. 9A-9D, a reflector plate 200 is formed directly on the back surface 11 of the semiconductor substrate. FIG. 9A is a vertical cross-sectional view. FIGS. 9B and 9D are horizontal cross-sectional views of the first exemplary semiconductor structure along the planes B-B' and D-D' of FIG. 9A, respectively. FIG. 9C is a bottom-up view of the first exemplary semiconductor structure of FIGS. 9A, 9B, and 9D.

The reflector plate 200 may be formed by formation of a metallic conductive layer, for example, by chemical vapor deposition (CVD), physical vapor deposition (PVD), electroplating, electroless plating, or a combination thereof. The metallic conductive layer may be lithographically patterned to form the reflector plate 200.

The reflector plate 200 comprises a metallic material such as copper, aluminum, tungsten, gold, silver, bronze, etc. Preferably, the thickness of the reflector plate 200 is greater than the skin depth of the metallic material comprising the reflector plate 200. More preferably, the thickness of the reflector plate 200 is at least a multiple of the skin depth of the metallic material comprising the reflector plate 200. Typically, the skin depth is inversely proportional to the square root of the frequency of the electromagnetic signal. For an electromagnetic signal at 100 GHz, the skin depths of aluminum, copper, gold, and silver are 0.26 micron, 0.21 micron, 0.26 micron, and 0.20 micron. Typically, the thickness of the reflector plate 200 is from about 2 micron to about 20 microns, and typically about 10 microns, although lesser and greater thicknesses are also contemplated herein.

The reflector plate 200 is formed directly on the at least one through substrate conductive via 22, thereby being electrically connected to the millimeter wave transceiver 62, and typically to electrical ground of the circuit in the millimeter wave transceiver 62. The reflector plate 200 is formed directly on the array of the through substrate dielectric vias 30. Preferably, the entirety of the coaxially aligned pair of first antenna portions of the antenna 100 overlies the reflector plate 200.

The reflector plate 200 reflects the electromagnetic signal that the antenna 100 transmits or captures, thereby enhancing the effectiveness of the antenna 100. Proper placement of the reflector plate 200 may increase the effectiveness of the antenna up to a factor of 4, and enhance the directionality of transmission of electromagnetic signal. For the reflector plate 200 to provide maximum efficiency to the antenna 100, the spacing s between the antenna 100 and the reflector plate 200 needs to be about a quarter wavelength of the electromagnetic signal in the medium between the antenna 100 and the reflector plate 200.

For millimeter waves, the quarter wavelength in vacuum is from about 250 microns to about 2,500 microns. Assuming a dielectric constant range from about 2.5, which is about the dielectric constant of a porous low-k chemical vapor deposition (CVD) oxide, to about 8.0, which would be obtained if the array of the through substrate dielectric vias 30 is filled with silicon oxide having a dielectric constant of 3.9 and the high resistivity semiconductor portion comprise silicon having a dielectric constant of 11.9 at 100 GHz, and the volume of the silicon oxide is about 50% of the total volume between the antenna 100 and the reflector plate 200, the equivalent dielectric constant between 100 and 200 can be around 7 to 8, the range of the quarter wavelength in the equivalent dielectric constant may be from about 90 microns to about 900 microns. Due to the difficulty of thinning the semiconductor substrate below 50 microns, a practical range for the spacing s between the antenna 100 and the reflector plate 200 is from about 50 microns to about 750 microns, which is within the range of thickness for semiconductor substrate 8 that may be obtained without thinning or with thinning.

Figure 10:
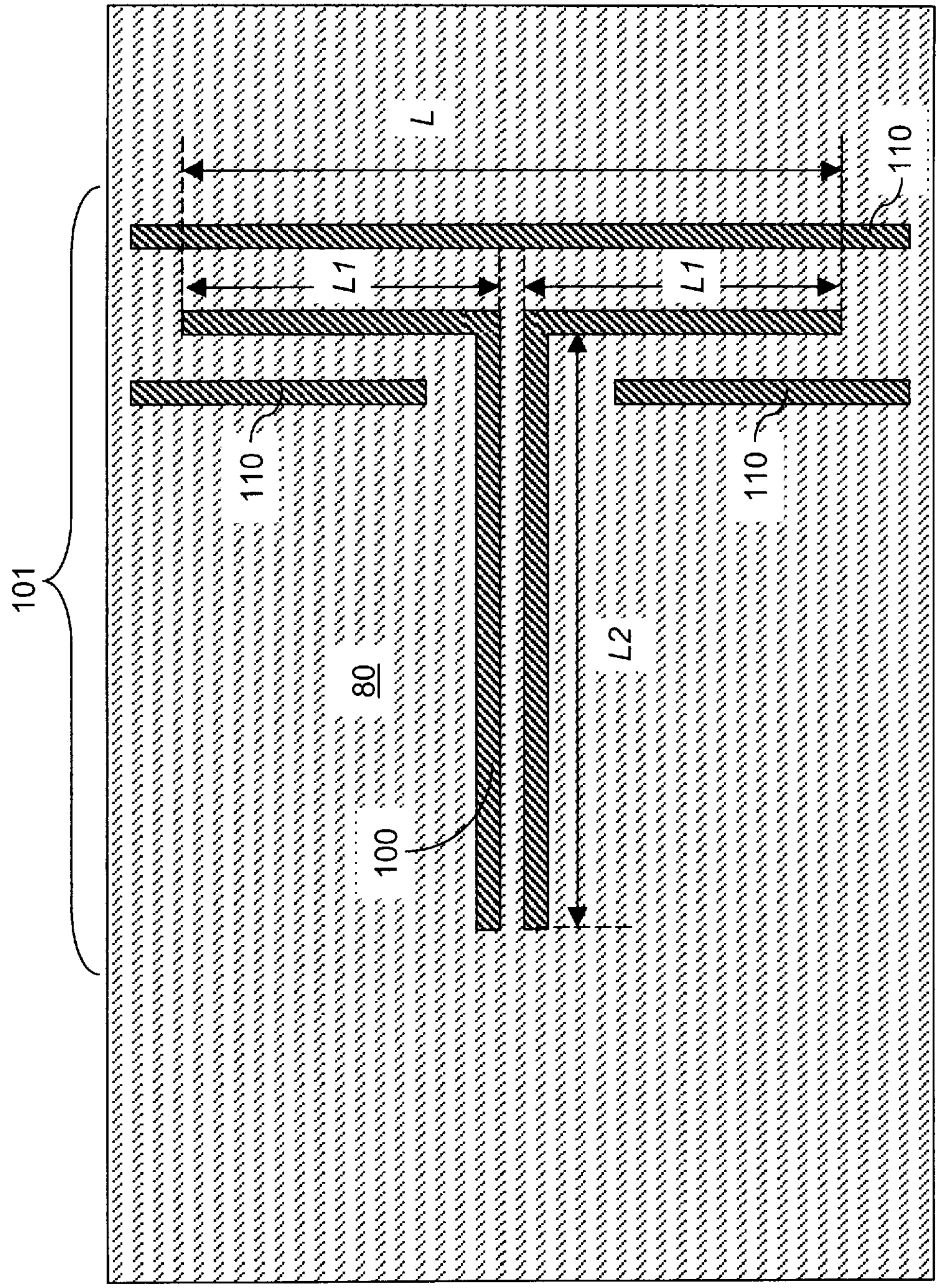
FIG. 10 is a horizontal cross-sectional view of a second exemplary semiconductor structure along a plane equivalent to plane B-B' of FIG. 9A at a step corresponding to FIGS. 9A-9D according to a second embodiment of the present invention, and shows a first alternative configuration for an antenna.

Referring to FIG. 10, a horizontal cross-sectional view of a second exemplary semiconductor structure along a plane equivalent to plane B-B' of FIG. 9A is shown at a step corresponding to FIGS. 9A-9D according to a second embodiment of the present invention. The second exemplary semiconductor structure is derived from the first exemplary semiconductor structure by modifying the pattern of remaining portions of the metallic material layer from which the antenna 100 is patterned at the step of the first embodiment corresponding to FIGS. 3A and 3B. A first alternative antenna 101, which is a first alternative configuration for an antenna, is formed in the second embodiment instead of the antenna 100 in the first embodiment.

The first alternative antenna 100 comprises the antenna 100 as in the first embodiment and antenna waveguide portions 110, which improves directionality for transmission and reception of electromagnetic signals. Additional antenna waveguide portions may be optionally formed.

Figure 11:
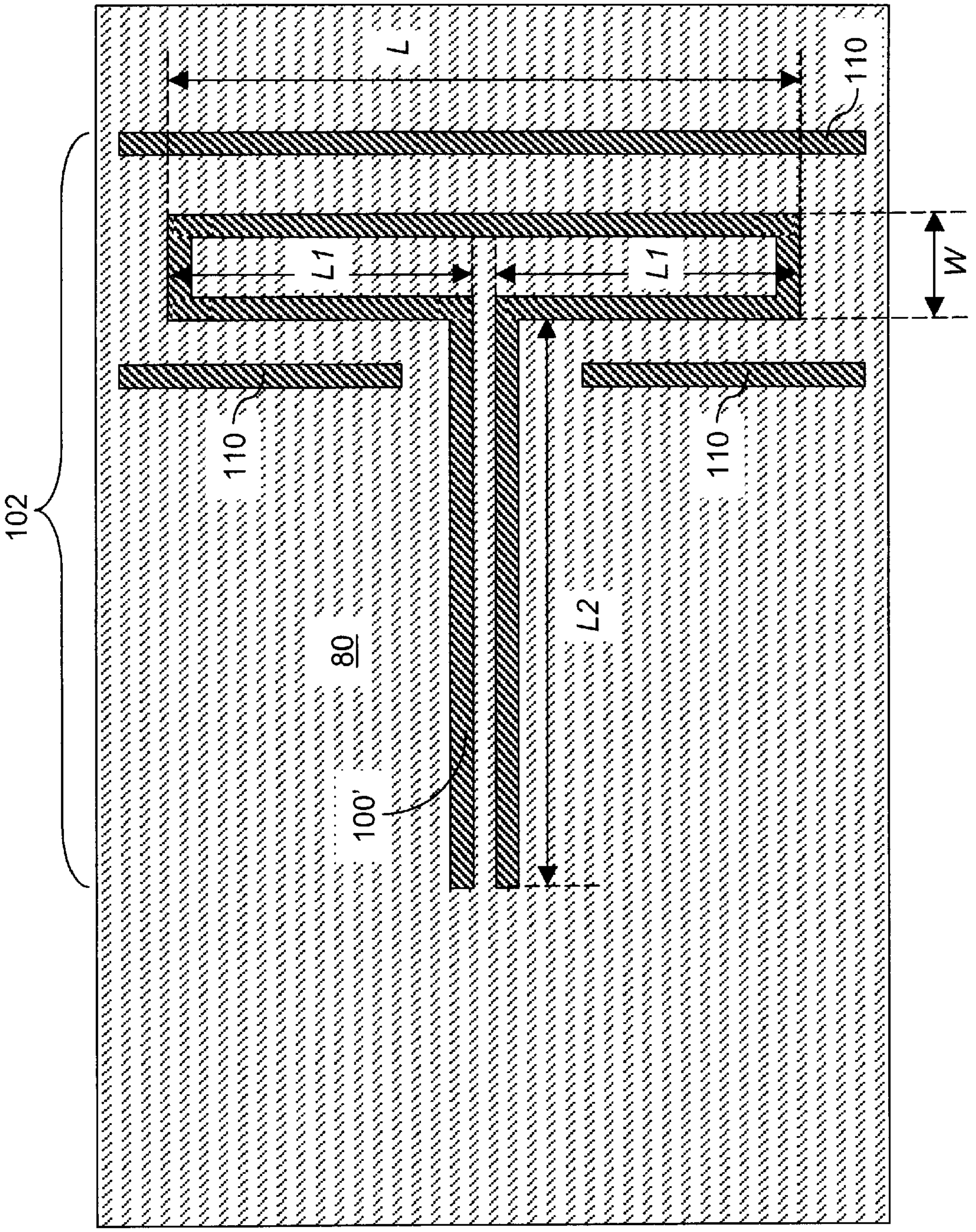
FIG. 11 is a horizontal cross-sectional view of a third exemplary semiconductor structure along a plane equivalent to plane B-B' of FIG. 9A at a step corresponding to FIGS. 9A-9D according to a third embodiment of the present invention, and shows a second alternative configuration for an antenna.

Referring to FIG. 11, a horizontal cross-sectional view of a third exemplary semiconductor structure along a plane equivalent to plane B-B' of FIG. 9A is shown at a step corresponding to FIGS. 9A-9D according to a third embodiment of the present invention. The third exemplary semiconductor structure is derived from the first exemplary semiconductor structure by modifying the pattern of remaining portions of the metallic material layer from which the antenna 100 is patterned at the step of the first embodiment corresponding to FIGS. 3A and 3B. A second alternative antenna 102, which is a second alternative configuration for an antenna, is formed in the third embodiment instead of the antenna 100 in the first embodiment.

The second alternative antenna 102 comprises a closed loop antenna 100' and antenna waveguide portions 110, which improves directionality for transmission and reception of electromagnetic signals. The closed loop antenna 100' include all portions of the antenna 100 in the first embodiment as well as a pair of transverse extension portions directly abutting the distal ends of the antenna 100 of the first embodiment and a longitudinal portion directly abutting ends of the pair of transverse extension portions. Additional antenna waveguide portions may be optionally formed.

Figure 12:
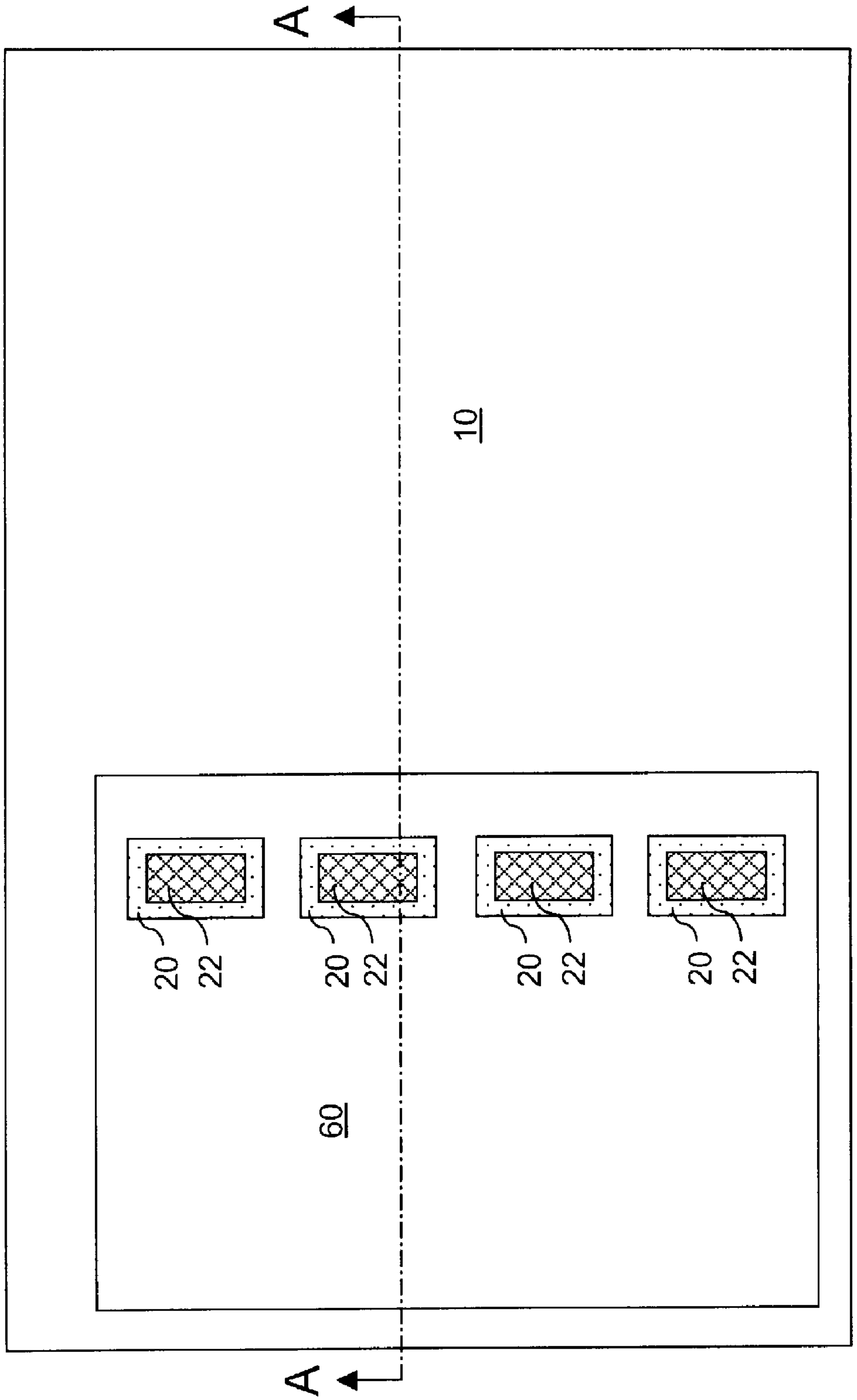
FIG. 12 is a horizontal cross-sectional view of a fourth exemplary semiconductor structure along a plane equivalent to plane D-D' of FIG. 9A at a step corresponding to FIGS. 9A-9D according to a fourth embodiment of the present invention, in which an array of through substrate dielectric vias is not present.

Referring to FIG. 12, a horizontal cross-sectional view of a fourth exemplary semiconductor structure along a plane equivalent to plane D-D' of FIG. 9A is shown at a step corresponding to FIGS. 9A-9D according to a fourth embodiment of the present invention. In the fourth exemplary semiconductor structure, formation of the array of the through substrate trenches 29 and the array of the through substrate dielectric vias 30 is omitted from the first embodiment. The dielectric constant of the high resistivity semiconductor portion 10 between the reflector plate 200 and the antenna 100 remain unchanged. In this configuration, the semiconductor substrate 8 is thinned to a thickness from about 50 μm to about 200 μm, or to a thickness less than 50 μm that is technically feasible. This configuration may be employed for a limited frequency range, for example, from about 30 GHz to about 120 GHz of the millimeter wave range.

Figure 13:
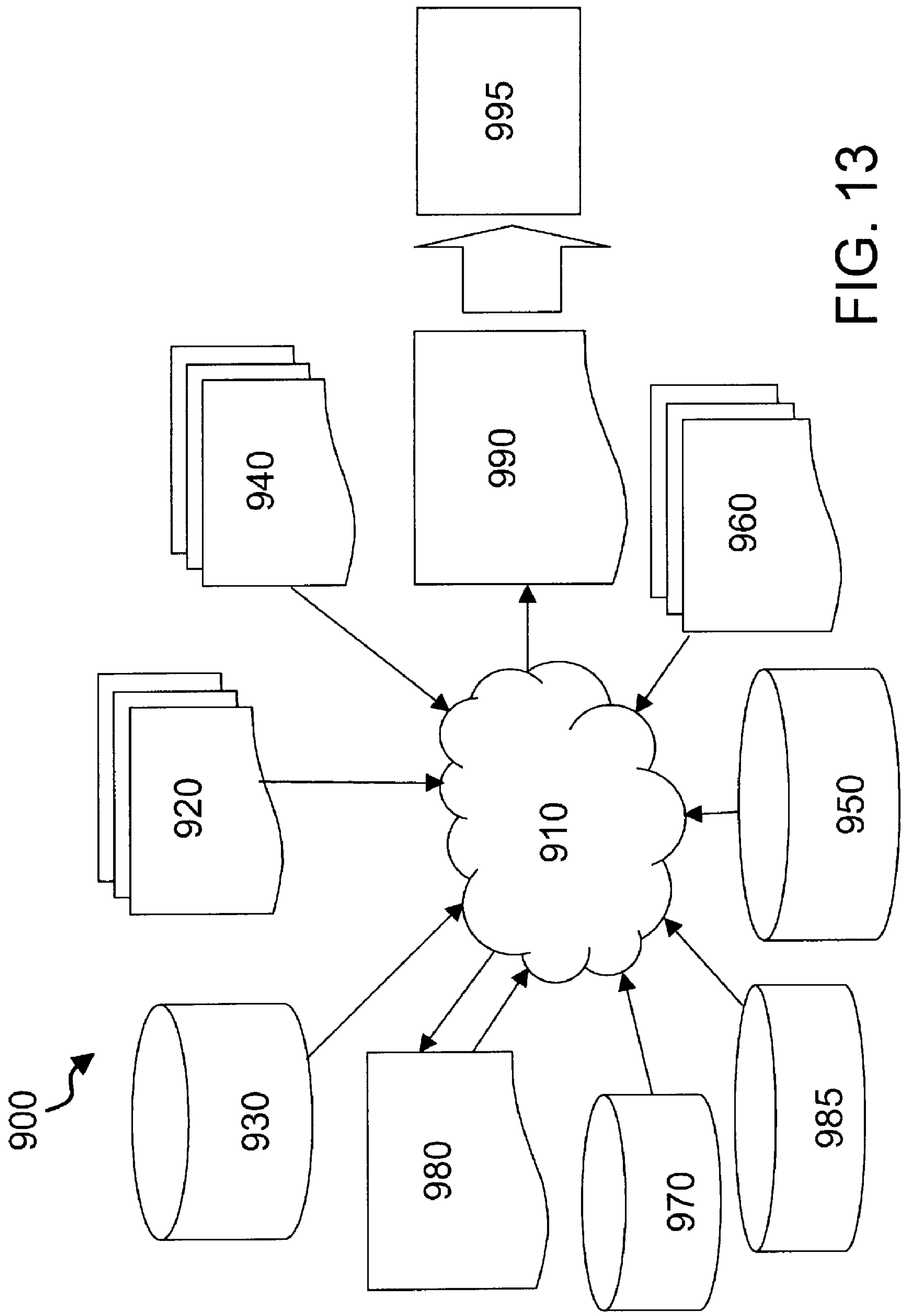
FIG. 13 is a flow diagram of a design process used in semiconductor design and manufacture of the semiconductor structures according to the present invention.

FIG. 13 shows a block diagram of an exemplary design flow 900 used for example, in semiconductor IC logic design, simulation, test, layout, and manufacture. Design flow 900 includes processes and mechanisms for processing design structures or devices to generate logically or otherwise functionally equivalent representations of the design structures and/or devices described above and shown in FIGS. 1, 2A, 2B, 3A, 3B, 4-8, 9A-9D, and 10-12. The design structures processes and/or generated by design flow 900 may be encoded on machine-readable transmission or storage media to include data and/or instructions that, when executed or otherwise processes on a data processing system, generate a logically, structurally, mechanically, or otherwise functionally equivalent representation of hardware components, circuits, devices, or systems. Design flow 900 may vary depending on the type of representation being designed. For example, a design flow for building an application specific integrated circuit (ASIC) may differ from a design flow 900 for designing a standard component or from a design flow 900 for instantiating the design into a programmable array, for example, a programmable gate array (PGA) or a field programmable gate array (FPGA) offered by Altera® Inc. or Xilinx® Inc.

FIG. 13 illustrates multiple such design structures including an input design structure 920 that is preferably processed by design process 910. Design structure 920 may be a logical simulation design structure generated and processed by design process 910 to produce a logically equivalent functional representation of a hardware device. Design structure 920 may also, or alternately, comprise data and/or program instructions that, when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1, 2A, 2B, 3A, 3B, 4-8, 9A-9D, and 10-12. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1, 2A, 2B, 3A, 3B, 4-8, 9A-9D, and 10-12 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990. Design structure 990 resides on a storage medium or programmable gate array in a data format used for the exchange of data of mechanical devices and structures (e.g. information stored in an IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1, 2A, 2B, 3A, 3B, 4-8, 9A-9D, and 10-12. In one embodiment, design structure 990 may comprise a compiled, executable HDL simulation model that functionally simulates the devices shown in FIGS. 1, 2A, 2B, 3A, 3B, 4-8, 9A-9D, and 10-12.

Design structure 990 may also employ a data format used for the exchange of layout data of integrated circuits and/or symbolic data format (e.g. information stored in a GDSII (GDS2), GLI, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1, 2A, 2B, 3A, 3B, 4-8, 9A-9D, and 10-12. Design structure 990 may then proceed to a stage 995 where, for example, design structure 990: proceeds to tape-out, is released to manufacturing, is released to a mask house, is sent to another design house, is sent back to the customer, etc.

While the invention has been described in terms of specific embodiments, it is evident in view of the foregoing description that numerous alternatives, modifications and variations will be apparent to those skilled in the art. Accordingly, the invention is intended to encompass all such alternatives, modifications and variations which fall within the scope and spirit of the invention and the following claims.

What is claimed is:

1. A method of forming a semiconductor structure comprising:

forming a millimeter wave transceiver on a semiconductor substrate;

forming at least one dielectric material layer on and above said millimeter wave transceiver;

forming an antenna electrically connected to said millimeter wave transceiver through an electrically conductive path directly on a topmost surface of said at least one dielectric material layer after forming said at least one dielectric material layer, wherein said antenna comprises a coaxially aligned pair of first antenna portions each having a first length and a pair of second antenna portions having a constant separation distance, wherein each second antenna portion has a second length and is directly adjoined to an end of one of said first antenna portions;

forming at least one through substrate conductive via through said semiconductor substrate and directly on said millimeter wave transceiver; and forming a reflector plate directly on said at least one through substrate conductive via.

2. The method of claim 1, wherein said electrically conductive path is provided by forming a pair of metal interconnect structures abutting said millimeter wave transceiver in said at least one dielectric material layer prior to forming said antenna, wherein said antenna abuts said pair of metal interconnect structures after said antenna is formed.

3. The method of claim 2, further comprising forming another dielectric material layer directly on said antenna and directly on said topmost surface of said at least one dielectric material layer, wherein said antenna is encapsulated by said at least one dielectric material layer, said other dielectric material layer, and said pair of metal interconnect structures.

4. The method of claim 1, wherein said millimeter wave transceiver is formed directly on a front surface of said semiconductor substrate, and wherein said reflector plate is located directly on a back surface of said semiconductor substrate.

5. The method of claim 1, wherein said antenna comprises a metallic material and said reflector plate comprises another metallic material.

6. The method of claim 1, further comprising forming an array of through substrate trenches through said semiconductor substrate.

7. The method of claim 1 wherein said semiconductor substrate includes a high resistivity portion having a resistivity of at least 20 Ohm-cm, and wherein said reflector plate is formed directly on said high resistivity portion.

8. The method of claim 7, further comprising foaming a low resistivity portion having a resistivity of less than 5 Ohm-cm by introducing dopants into a portion of said high resistivity portion, wherein said millimeter wave transceiver is formed directly on said low resistivity portion.

9. The method of claim 1, wherein said first length is from about 30 microns to about 1,000 microns, and wherein said second length is from about 60 microns to about 1,000 microns.

10. The method of claim 1, wherein an entirety of said coaxially aligned pair of first antenna portions overlies said reflector plate.

11. The method of claim 1, further comprising:

forming at least one through substrate trench through said semiconductor substrate; and filling said at least ones through substrate trench with a conductive material, wherein said at least one through substrate conductive via is formed by said conductive material.

12. The method of claim 11, further comprising forming a dielectric liner on sidewalls of said at least one through substrate trench, wherein said at least one through substrate conductive via is laterally surrounded by said dielectric liner.

13. The method of claim 1, further comprising:

forming a metallic material layer directly on said at least one dielectric material layer;

lithographically patterning said metallic material layer, wherein remaining portions of said metallic material layer after said lithographic patterning constitutes an entirety of said antenna.

14. The method of claim 6, wherein said array of through substrate trenches is formed after forming said at least one dielectric material layer by removing portions of said semiconductor substrate from a surface located on an opposite side of said millimeter wave transceiver.

15. The method of claim 6, wherein semiconductor substrate includes a high resistivity semiconductor portion having a resistivity greater than 20 Ohms-cm and a low resistivity semiconductor portion having a resistivity less than 5 Ohm-cm, and said array of through substrate trenches is formed in a region of said high resistivity semiconductor portion that does not overlie or underlie said low resistivity semiconductor portion.

16. The method of claim 6, further comprising forming an array of through substrate dielectric vias by filling said array of through substrate trenches with a dielectric material.

17. The method of claim 1, wherein said at least one through substrate conductive via is formed through a high resistivity semiconductor portion having a resistivity greater than 20 Ohms-cm and a low resistivity semiconductor portion having a resistivity less than 5 Ohm-cm.

18. A method of forming a semiconductor structure comprising:

forming a millimeter wave transceiver on a semiconductor substrate;

forming at least one dielectric material layer on and above said millimeter wave transceiver;

forming an antenna electrically connected to said millimeter wave transceiver on said at least one dielectric material layer, wherein said antenna comprises a coaxially aligned pair of first antenna portions each having a first length and a pair of second antenna portions having a constant separation distance, wherein each second antenna portion has a second length and is directly adjoined to an end of one of said first antenna portions;

forming at least one through substrate conductive via through said semiconductor substrate and directly on said millimeter wave transceiver; and forming a reflector plate directly on said at least one through substrate conductive via.

* * * * *